United States Patent
Forbes Jones et al.

(10) Patent No.: US 7,803,212 B2
(45) Date of Patent: Sep. 28, 2010

(54) APPARATUS AND METHOD FOR CLEAN, RAPIDLY SOLIDIFIED ALLOYS

(75) Inventors: Robin M. Forbes Jones, Charlotte, NC (US); Richard L. Kennedy, Monroe, NC (US)

(73) Assignee: ATI Properties, Inc., Albany, OR (US)

( * ) Notice: Subject to any disclaimer, the term of this patent is extended or adjusted under 35 U.S.C. 154(b) by 202 days.

(21) Appl. No.: 12/053,245

(22) Filed: Mar. 21, 2008

(65) Prior Publication Data

US 2008/0179034 A1    Jul. 31, 2008

Related U.S. Application Data

(63) Continuation-in-part of application No. 11/232,702, filed on Sep. 22, 2005, now Pat. No. 7,578,960.

(51) Int. Cl.
    B22F 9/14    (2006.01)
(52) U.S. Cl. .............................. 75/336; 75/345; 164/46
(58) Field of Classification Search .................. None
    See application file for complete search history.

(56) References Cited

U.S. PATENT DOCUMENTS

| | | |
|---|---|---|
| 3,005,246 A | 10/1961 | Murphy et al. |
| 3,072,982 A | 1/1963 | Gordon et al. |
| 3,101,515 A | 8/1963 | Hanks |
| 3,389,208 A | 6/1968 | Roberts et al. |
| 3,420,977 A | 1/1969 | Hanks et al. |
| 3,519,059 A | 7/1970 | Voskoboinikov et al. |
| 3,547,622 A | 12/1970 | Hutchinson |
| 3,576,207 A | 4/1971 | Grenfell et al. |
| 3,627,293 A | 12/1971 | Sperner |
| 3,690,635 A | 9/1972 | Harker et al. |
| 3,737,305 A | 6/1973 | Blayden et al. |
| 3,817,503 A | 6/1974 | Lafferty et al. |
| 3,825,415 A | 7/1974 | Johnston et al. |

(Continued)

FOREIGN PATENT DOCUMENTS

CA    2048836    3/1983

(Continued)

OTHER PUBLICATIONS

D.E. Tyler and W.G. Watson, "Nucleated Casting", *Proceedings of the Third International Conference on Spray Forming*, Sep. 1996, pp. 233-242.

(Continued)

*Primary Examiner*—George Wyszomierski
(74) *Attorney, Agent, or Firm*—Kirkpatrick & Lockhart Preston Gates Ellis LLP; Patrick J. Viccaro; John E. Grosselin, III

(57) ABSTRACT

One non-limiting embodiment of an apparatus for forming an alloy powder or preform includes a melting assembly, an atomizing assembly, and a collector. The melting assembly produces at least one of a stream of a molten alloy and a series of droplets of a molten alloy, and may be substantially free from ceramic in regions contacted by the molten alloy. The atomizing assembly generates electrons and impinges the electrons on molten alloy from the melting assembly, thereby producing molten alloy particles.

21 Claims, 12 Drawing Sheets

U.S. PATENT DOCUMENTS

| | | | |
|---|---|---|---|
| 3,826,301 A | 7/1974 | Brooks | |
| 3,868,987 A | 3/1975 | Galey et al. | |
| 3,896,258 A | 7/1975 | Hanks | |
| 3,909,921 A | 10/1975 | Brooks | |
| 3,970,892 A | 7/1976 | Wakalopulos | |
| 3,972,713 A | 8/1976 | Muzyka et al. | |
| 3,985,177 A | 10/1976 | Buehler | |
| 3,988,084 A | 10/1976 | Esposito et al. | |
| 3,989,091 A | 11/1976 | Medovar et al. | |
| 4,025,818 A | 5/1977 | Giguere et al. | |
| 4,058,697 A | 11/1977 | Sokolov et al. | |
| 4,062,700 A | 12/1977 | Hayami et al. | |
| 4,066,117 A | 1/1978 | Clark et al. | |
| 4,136,527 A | 1/1979 | Kading | |
| 4,190,404 A | 2/1980 | Drs et al. | |
| 4,221,587 A | 9/1980 | Ray | |
| 4,261,412 A | 4/1981 | Pryor et al. | |
| 4,264,641 A | 4/1981 | Mahoney et al. | |
| 4,272,463 A | 6/1981 | Clark et al. | |
| 4,305,451 A | 12/1981 | Ksendzyk et al. | |
| 4,343,433 A | 8/1982 | Sickles | |
| 4,426,141 A | 1/1984 | Holcomb | |
| 4,441,542 A | 4/1984 | Pryor et al. | |
| 4,449,568 A | 5/1984 | Narasimham | |
| 4,471,831 A | 9/1984 | Ray | |
| 4,482,376 A | 11/1984 | Tarasescu et al. | |
| 4,544,404 A | 10/1985 | Yolton et al. | |
| 4,575,325 A | 3/1986 | Duerig et al. | |
| 4,596,945 A | 6/1986 | Schumacher et al. | |
| 4,619,597 A | 10/1986 | Miller | |
| 4,619,845 A | 10/1986 | Ayers et al. | |
| 4,631,013 A | 12/1986 | Miller | |
| 4,642,522 A | 2/1987 | Harvey et al. | |
| 4,645,978 A | 2/1987 | Harvey et al. | |
| 4,689,074 A | 8/1987 | Seaman et al. | |
| 4,694,222 A | 9/1987 | Wakalopulos | |
| 4,738,713 A | 4/1988 | Stickle | |
| 4,755,722 A | 7/1988 | Wakalopulos | |
| 4,762,553 A | 8/1988 | Savage et al. | |
| 4,762,975 A | 8/1988 | Mahoney et al. | |
| 4,769,064 A | 9/1988 | Buss et al. | |
| 4,779,802 A | 10/1988 | Coombs | |
| 4,786,844 A | 11/1988 | Farrell et al. | |
| 4,788,016 A | 11/1988 | Colclough et al. | |
| 4,801,411 A | 1/1989 | Wellinghoff et al. | |
| 4,801,412 A | 1/1989 | Miller | |
| 4,838,340 A | 6/1989 | Entrekin et al. | |
| 4,842,170 A | 6/1989 | Del Vecchio et al. | |
| 4,842,704 A | 6/1989 | Collins et al. | |
| 4,910,435 A | 3/1990 | Wakalopulos | |
| 4,916,361 A | 4/1990 | Schumacher et al. | |
| 4,919,335 A | 4/1990 | Hobson et al. | |
| 4,926,923 A | 5/1990 | Brooks et al. | |
| 4,931,091 A | 6/1990 | Waite et al. | |
| 4,932,635 A | 6/1990 | Harker | |
| 4,938,275 A | 7/1990 | Leatham et al. | |
| 4,955,045 A | 9/1990 | Friede et al. | |
| 4,961,776 A | 10/1990 | Harker | |
| 5,004,153 A | 4/1991 | Sawyer | |
| 5,074,933 A | 12/1991 | Ashok et al. | |
| 5,084,091 A | 1/1992 | Yolton | |
| 5,104,634 A | 4/1992 | Calcote | |
| 5,142,549 A | 8/1992 | Bremer | |
| 5,160,532 A | 11/1992 | Benz et al. | |
| 5,176,874 A | 1/1993 | Mourer et al. | |
| 5,222,547 A | 6/1993 | Harker | |
| 5,226,946 A | 7/1993 | Diehm et al. | |
| 5,240,067 A | 8/1993 | Hatch | |
| 5,263,044 A | 11/1993 | Bremer | |
| 5,266,098 A | 11/1993 | Chun et al. | |
| 5,268,018 A | 12/1993 | Mourer et al. | |
| 5,272,718 A | 12/1993 | Stenzel et al. | |
| 5,291,940 A | 3/1994 | Borofka et al. | |
| 5,296,274 A | 3/1994 | Movchan et al. | |
| 5,302,881 A | 4/1994 | O'Loughlin | |
| 5,310,165 A | 5/1994 | Benz et al. | |
| 5,325,906 A | 7/1994 | Benz et al. | |
| 5,332,197 A | 7/1994 | Benz et al. | |
| 5,348,566 A | 9/1994 | Sawyer et al. | |
| 5,366,206 A | 11/1994 | Sawyer et al. | |
| 5,368,897 A | 11/1994 | Kurihara et al. | |
| 5,377,961 A | 1/1995 | Smith et al. | |
| 5,378,957 A | 1/1995 | Kelly | |
| 5,381,847 A | 1/1995 | Ashok et al. | |
| 5,384,821 A * | 1/1995 | Jedlitschka et al. | 378/199 |
| 5,472,177 A | 12/1995 | Benz et al. | |
| 5,480,097 A | 1/1996 | Carter, Jr. et al. | |
| 5,503,655 A | 4/1996 | Joseph | |
| 5,527,381 A | 6/1996 | Waite et al. | |
| 5,649,992 A | 7/1997 | Carter, Jr. et al. | |
| 5,649,993 A | 7/1997 | Carter, Jr. et al. | |
| 5,683,653 A | 11/1997 | Benz et al. | |
| 5,699,850 A | 12/1997 | Beitelman et al. | |
| 5,722,479 A | 3/1998 | Oeftering | |
| 5,749,938 A | 5/1998 | Coombs | |
| 5,749,989 A | 5/1998 | Linman et al. | |
| 5,769,151 A | 6/1998 | Carter, Jr. et al. | |
| 5,809,057 A | 9/1998 | Benz et al. | |
| 5,810,066 A | 9/1998 | Knudsen et al. | |
| 5,894,980 A | 4/1999 | Orme-Marmarelis et al. | |
| 5,954,112 A | 9/1999 | Forbes Jones et al. | |
| 5,985,206 A | 11/1999 | Zabala et al. | |
| 6,068,043 A | 5/2000 | Clark | |
| 6,103,182 A | 8/2000 | Campbell | |
| 6,162,377 A | 12/2000 | Ghosh et al. | |
| 6,168,666 B1 | 1/2001 | Sun | |
| 6,264,717 B1 | 7/2001 | Carter, Jr. et al. | |
| 6,350,293 B1 | 2/2002 | Carter, Jr. et al. | |
| 6,416,564 B1 | 7/2002 | Bond | |
| 6,427,752 B1 | 8/2002 | Carter, Jr. et al. | |
| 6,460,595 B1 | 10/2002 | Benz et al. | |
| 6,491,737 B2 | 12/2002 | Orme-Marmerelis et al. | |
| 6,496,529 B1 | 12/2002 | Forbes Jones et al. | |
| 6,562,099 B2 | 5/2003 | Orme-Marmerelis et al. | |
| 6,631,753 B1 | 10/2003 | Carter, Jr. et al. | |
| 6,772,961 B2 | 8/2004 | Forbes Jones et al. | |
| 6,904,955 B2 | 6/2005 | Jackson et al. | |
| 6,975,073 B2 | 12/2005 | Wakalopulos | |
| 7,152,432 B2 | 1/2006 | Forbes Jones et al. | |
| 7,033,444 B1 | 4/2006 | Komino et al. | |
| 7,114,548 B2 | 10/2006 | Forbes Jones et al. | |
| 7,150,412 B2 | 12/2006 | Wang et al. | |
| 7,154,932 B2 | 12/2006 | Forbes Jones et al. | |
| 7,337,745 B1 | 3/2008 | Komino et al. | |
| 7,374,598 B2 | 5/2008 | Forbes Jones et al. | |
| 7,439,188 B2 | 10/2008 | DeOrnellas et al. | |
| 2005/0173847 A1 | 8/2005 | Blackburn et al. | |
| 2007/0062332 A1 | 3/2007 | Forbes Jones et al. | |
| 2007/0151695 A1 | 7/2007 | Forbes Jones et al. | |
| 2008/0072707 A1 | 3/2008 | Forbes Jones et al. | |
| 2008/0115905 A1 | 5/2008 | Forbes Jones et al. | |
| 2008/0179033 A1 | 7/2008 | Forbes Jones et al. | |
| 2008/0223174 A1 | 9/2008 | Forbes Jones et al. | |
| 2009/0139682 A1 | 6/2009 | Forbes Jones et al. | |
| 2010/0012629 A1 | 1/2010 | Forbes Jones et al. | |

FOREIGN PATENT DOCUMENTS

| | | |
|---|---|---|
| CA | 2048836 A1 | 4/1992 |
| DE | 3810294 | 12/1985 |
| DE | 3810294 | 10/1988 |
| DE | 4011392 B4 | 4/2004 |
| EP | 0073585 A1 | 3/1983 |
| EP | 0095298 A1 | 11/1983 |

| | | |
|---|---|---|
| EP | 0073585 A1 | 1/1986 |
| EP | 0225732 B1 | 6/1987 |
| EP | 0400089 B1 | 10/1988 |
| EP | 0428527 B1 | 10/1988 |
| EP | 0486830 A2 | 2/1990 |
| EP | 1101552 A2 | 2/1991 |
| EP | 0486830 A2 | 5/1992 |
| EP | 0400089 B1 | 6/1993 |
| EP | 0428527 B1 | 8/1996 |
| EP | 1101552 A2 | 5/2001 |
| GB | 2203889 A | 10/1988 |
| GB | 2203889 A | 4/1992 |
| JP | 3-36205 A | 2/1991 |
| JP | H03-36205 | 5/1992 |
| RU | 2089633 C1 | 6/1993 |
| RU | 2089633 C1 | 9/1997 |
| WO | WO 85/05489 A1 | 12/1985 |
| WO | WO 86/00466 A1 | 1/1986 |
| WO | WO 90/01250 A1 | 2/1990 |
| WO | WO 97/49837 A1 | 12/1997 |
| WO | WO 01/96028 A1 | 12/2001 |
| WO | WO 02/40197 A2 | 5/2002 |

OTHER PUBLICATIONS

E.J. Lavernia and Y. Wu, "Spray Atomization and Deposition" (John Wiley & Sons, 1996), pp. 311-314.

L.A. Bertram et al., "Quantitative Simulations of a Superalloy VAR Ingot at the Macroscale", Proceedings of the 1997 International Symposium on Liquid Metal Processing and Casting, A. Mitchell and P. Auburtin, eds., (Am. Vac. Soc., 1997)., pp. 110-132.

Jom, "Solidification Processing of Materials in Magnetic Fields", copyright held by The Minerals, Metals & Materials Society, 1998.

William T. Carter, Jr. and Robin M. Forbes-Jones, "Nucleated Casting for Land-Based Gas Turbines", Advanced Materials & Processes, Jul. 2002, pp. 27-29.

Alan Leatham, "Spray Forming: Alloys, Products, and Markets", JOM-e, Apr. 1999 (vol. 51, No. 4) 13 pages.

W.T. Carter, Jr. et al. "The CMSF Process: The Spray Forming of Clean Metal", JOM-e, Apr. 1999 (vol. 51, No. 4) 7 pages.

William T. Carter, Jr. and Robin M. Forbes-Jones, "Nucleated Casting for the Production pf Large Superalloy Ingots", JOM, Apr. 2005, pp. 52-57.

Sears, Francis Weston, An Introduction to Thermodynamics, the Kinetic Theory of Gases, and Statistical Mechanics, 2nd Edition, Addison-Wesley, 1959, pp. 335-337.

Macky, W.A., "Some Investigations on the Deformation of Water Droplets in Strong Electric Fields", Proc. Roy. Soc. London, Series A, 133, pp. 565-587, 1931.

V. A. Chernov, "Powerful High-Voltage Glow Discharge Electron Gun and Power Unit on Its Base," 1994 Intern. Conf. on Electron Beam Melting (Reno, Nevada), pp. 259-267.

H. Duval, et al., "Theoretical and Experimental Approach of the Volatilization in Vacuum Metallurgy," pp. 83-97 (date unknown).

E. M. Oks, et al., "Development of Plasma Cathode Electron Guns," Physics of Plasmas, vol. 6, No. 5, pp. 1649-1654, May 1999.

W. Clark, "Electron Gun Technology," Hughes Research Laboratories, Final Report No. N00014-72-C-0496, 92 pages, Dec. 1976.

"Electron-Beam Melting of Titanium," printed from http://www.antares.com.ua, Internet site, website accessed on Apr. 4, 2007, 6 pages.

ALD Vacuum Technologies AG, "Electron Beam Melting (EB), Electron Beam Melting Processes and Furnaces," 6 pages, (date unknown).

G. Wakalopulos, "Pulsed WIP Electron Gun. Final Report—Fabrication Phase 1×40 cm and 1×70 cm Cooled WIP Electron Gun," Mar. 1979-Dec. 1980.

W. M. Clark, et al., "Ion Plasma Electron Gun Research," Dec. 1977.

G. Sanchez, et al., "Thermal Effect of Ion Implantation with Ultra-Short Ion Beams," Surface and Coatings Technology, vol. 70, pp. 181-186 (1995).

M. L. Sentis, et al., "Parametric Studies of X-Ray Preionized Discharge XeCl Laser at Single Short and at High Pulse Rate Frequency (1 kHz)," J. Appl. Phys., vol. 66, No. 5, pp. 1925-1930, Sep. 1, 1989.

L. Arif, et al., "Waves Behaviour in a High Repetition High Average Power Excimer Laser," SPIE vol. 1031 GCL—Seventh International Symposium on Gas Flow and Chemical Lasers, pp. 392-399 (1988).

N. N. Semashko, "Sources of Gas-Ion Beams with Current up to 60 A for Controlled Thermonuclear Fusion and Technological Applications," Atomic Energy, vol. 82, No. 1, pp. 21-27, 1997.

B. A. Knyazev, et al., "Pulsed Plasma Sources for the Production of Intense Ion Beams Based on "Catalytic" Resonance Ionization," 18 pages, 1994.

B. L. Fontaine, et al., "Performance Characteristics of a Long Pulse and High Average Power XeCl Discharge Laser," SPIE vol. 801, High Power Lasers, pp. 100-105 (1987).

Sandia National Labs, "Particle Beam Fusion Progress Report, Jan.-Jun. 1980," published May 1981.

P. F. McKay, "Development of a Twelve-Plasma Gun, Single-Pulser Combination for Use in the PBFA-1 Hybrid Ion Diode," published Oct. 1985.

A. J. Cohen, "Anomalous Diffusion in a Plasma Formed from the Exhaust Beam of an Electron-Bombardment Ion Thruster," published Aug. 1968.

L. E. Weddle, "Ion Gun Generated Electromagnetic Interference on the Scatha Satellite," Dec. 1987.

S. Suckewer, "Spectral Measurements of Plasma Temperature in the Rod Plasma Injector (RPI)," Nukleonika, No. 1, 1970.

R. C. Olsen, et al., "Plasma Wave Observations During Ion Gun Experiments," Journal of Geophysical Research, vol. 95, No. A6, pp. 7759-7771, Jun. 1, 1990.

Y. Kiwamoto, "Small Barium Rail Gun for Plasma Injection," Rev. Sci. Instrum., vol. 51. No. 3, pp. 285-287, Mar. 1980.

S. Humphries, Jr., et al., "Pulsed Plasma guns for Intense Ion Beam Injectors," Rev. Sci. Instrum. vol. 52, No. 2, pp. 162-171, Feb. 1981.

H. Tamura, et al., "A Plasma Ion Gun with Pierce Electrode," Japan J. Appl. Phys. 5, pp. 985-987 (1966).

V. M. Chicherov, "Density Distribution of Hydrogen in the Interior of a Coaxial Plasma Injector Prior to the Application of High Voltage to its Electrodes," Journal of Technical Physics, vol. 36, No. 6, pp. 1055-1057, 1966.

L. M. Smith, et al., "Interferometric Investigation of a Cablegun Plasma Injector," IEEE Transactions on Plasma Science, vol. 28, No. 6, pp. 2272-2275, Dec. 2000.

A. Vizir, et al., "Recent Development and Applications of Electron, Ion and Plasma Sources Based on Vacuum Arc and Low Pressure Glow," IEEE Int. Conf. Plasma Sci., p. 286 (2004).

Kuiken, Gerard, "Thermodynamics of Irreversible Processes: Applications to Diffusion and Rheology", John Wiley & Sons, Oct. 1994.

Cobine, James Dillon, "Gaseous Conductors: Theory and Engineering Applications", Dover Publications, Inc. New York (1958).

U.S. Appl. No. 12/055,415, filed Mar. 26, 2008.

ALD Vacuum Technologies: Electron Beam Melting (EB), printed from http://web.ald-vt.de/cms/vakuum-technologie/anlagen/electron-beam-melting-eb, website accessed on Aug. 25, 2009, 4 pages.

Bakish, R., "The Substance of Technology: Electron Beam Melting and Refining", JOM, Nov. 1998, pp. 28-30.

Office Action dated Dec. 21, 2007 in U.S. Appl. No. 11/232,702.

Office Action dated Jul. 18, 2008 in U.S. Appl. No. 11/232,702.

Office Action dated Dec. 12, 2008 in U.S. Appl. No. 11/232,702.

Notice of Allowance dated Apr. 13, 2009 in U.S. Appl. No. 11/232,702.

Office Action dated Mar. 11, 2009 in U.S. Appl. No. 11/933,361.

Office Action dated Nov. 10, 2009 in U.S. Appl. No. 11/933,361.

Office Action dated Feb. 13, 2009 in U.S. Appl. No. 11/841,941.

Office Action dated Oct. 1, 2009 in U.S. Appl. No. 11/841,941.

Office Action dated Jun. 28, 2007 in U.S. Appl. No. 10/913,361.

Office Action dated Sep. 26, 2007 in U.S. Appl. No. 10/913,361.

Notice of Allowance dated Jan. 14, 2008 in U.S. Appl. No. 10/913,361.

Office Action dated Dec. 19, 2002 in U.S. Appl. No. 10/158,382.

Office Action dated Jun. 3, 2003 in U.S. Appl. No. 10/158,382.

Office Action dated Mar. 18, 2004 in U.S. Appl. No. 10/158,382.

Office Action dated Dec. 29, 2004 in U.S. Appl. No. 10/158,382.

Office Action dated Aug. 25, 2005 in U.S. Appl. No. 10/158,382.
Notice of Allowance dated May 2, 2006 in U.S. Appl. No. 10/158,382.
Supplemental Notice of Allowability dated Jun. 12, 2006 in U.S. Appl. No. 10/158,382.
Supplemental Notice of Allowability dated Jun. 29, 2006 in U.S. Appl. No. 10/158,382.
Office Action dated Nov. 20, 2002 in U.S. Appl. No. 09/882,248.
Office Action dated Jan. 21, 2003 in U.S. Appl. No. 09/882,248.
Office Action dated Jul. 8, 2003 in U.S. Appl. No. 09/882,248.
Notice of Allowance dated Oct. 22, 2003 in U.S. Appl. No. 09/882,248.
Office Action dated Dec. 6, 2001 in U.S. Appl. No. 09/726,720.
Notice of Allowance dated Apr. 23, 2002 in U.S. Appl. No. 09/726,720.
Office Action dated Aug. 29, 2005 in U.S. Appl. No. 11/008,048.
Office Action dated Nov. 8, 2005 in U.S. Appl. No. 11/008,048.
Response to Rule 312 Communication dated Aug. 16, 2006 in U.S. Appl. No. 11/008,048.
Notice of Allowance dated Jun. 27, 2006 in U.S. Appl. No. 11/008,048.
Office Action dated Nov. 27, 2009 in U.S. Appl. No. 12/053,238.
Office Action dated Apr. 27, 2010 in U.S. Appl. No. 11/564,021.
Notice of Allowance dated Jun. 2, 2010 in U.S. Appl. No. 11/949,808.
Tien et al., "Superalloys, Supercomposites and Superceramics", Academic Press, Inc., Dec. 1989, pp. 49, 76-84.
Ausmus, S.L. and R.A. Beall, "Electroslag Melting of Titanium Slabs", Trans. Internat., Vacuum Metallurgy Conf., Dec. 1967, pp. 675-694.
Chronister et al., "Induction Skull Melting of Titanium and Other Reactive Alloys", Journal of Metals, Sep. 1986, pp. 51-54.

* cited by examiner

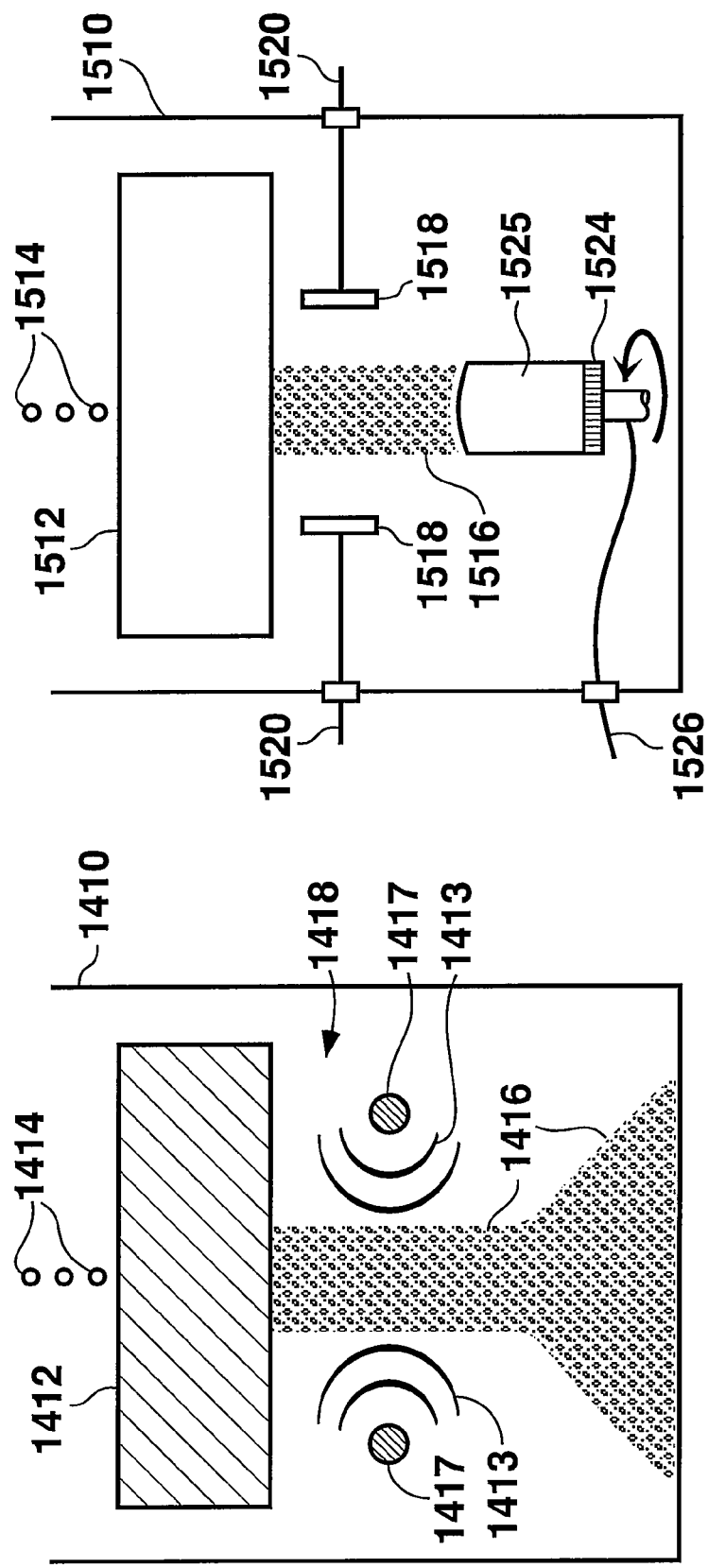

APPARATUS AND METHOD FOR CLEAN, RAPIDLY SOLIDIFIED ALLOYS

CROSS-REFERENCE TO RELATED APPLICATION

The present application is a continuation-in-part of, and claims priority under 35U.S.C. §120 to, U.S. patent application Ser. No. 11/232,702, filed Sep. 22, 2005, now U.S. Patent 7,578,960.

BACKGROUND OF THE TECHNOLOGY

1. Field of Technology

The present disclosure relates to apparatus and methods for melting and atomizing metals and alloys (collectively referred to herein as "alloys") under vacuum conditions to produce clean atomized molten materials that can be rapidly solidified as either powders or preforms. The solid preforms may be made from the atomized molten materials using techniques such as, for example, spray forming and nucleated casting. Collected powders may be further processed into various articles of manufacture. As an example, powders made by such apparatus and methods may be collected, containerized, and further processed to consolidate the powders into solid performs.

2. Description of the Background of the Technology

Current processes used to produce powder metal products typically employ conventional fluid atomization techniques to produce alloy powders. For example, conventional fluid atomization technology is used to produce alloy powders for the production of common pressed and sintered articles. Alloy powders also are used in more sophisticated settings, such as in the fabrication of materials from which critical aerospace components are fabricated.

In one conventional fluid atomization process, high pressure gas is impinged on a molten metal or alloy stream and physically breaks the stream up into small particles of fully or partially molten material. As these molten particles dissipate heat, they freeze, and they are collected as a solid powder. In certain critical applications, such as in the fabrication of certain aerospace components, batches of powder atomized from several small atomization runs are blended, and then the blend is sieved to small size (for example, −325 mesh), containerized in a metallic can, and consolidated into a suitable solid article (preform) by extruding or otherwise compacting the can and its powdered contents. The consolidated article can then be further processed into the desired shape and character by machining and other conventional techniques. Advantages of this process include the cleanliness, controlled and uniform composition, and relatively small grain size of the consolidated article, which may be critical to the performance of a component fabricated from the article.

The conventional process, combining steps of melting, atomization, blending, sieving, containerizing, and consolidating, suffers from several drawbacks. For example, the atomized powder from several small melts is used to form the blended powder. This is done since a melt must be poured through a relatively small orifice during powder formation, and the pour rate is significantly less than is used in casting or conventional melting. Thus, prior to being atomized, the alloy must remain molten for an extended period, which can result in deterioration of the alloy's chemical composition, through elemental volatilization and reactions with the ceramic liner of the melting vessel. Several small melts are atomized so as to minimize compositional deterioration of any one melt. Accordingly, the powder forming process is typically time-consuming and capital intensive. Also, the melts typically are produced in conventional ceramic-lined furnaces and, hence, the resultant powders are often contaminated with oxides. Once the powders are formed, they are then handled in several steps, each of which presents the possibility, and likelihood, of additional contamination. Also, because the process includes several steps, it is typically costly.

Various techniques have been developed to specifically address distinct steps in the process of forming consolidated articles from a melt using powder atomization. Several well known melting techniques have been developed that employ a vacuum environment and do not use a ceramic-lined furnace. These techniques result in significantly less oxide contamination in the melt relative to forming the melt in a conventional ceramic-lined furnace. For example, electron beam (EB) melting technology is now widely known and broadly discussed in the technical and patent literature. Another example is the vacuum double-electrode remelting (VADER) process, which is known in the art and described in, for example, U.S. Pat. No. 4,261,412. Other known techniques of forming molten alloy streams in ceramic-less melting devices are disclosed in, for example, U.S. Pat. Nos. 5,325,906 and 5,348,566. The '906 patent discloses a melting apparatus combining an electroslag remelting (ESR) device coupled to a cold induction guide (CIG). In one embodiment described in the '906 patent, a stream of molten refined material is produced by melting a consumable electrode in an ESR device. The molten stream passes, protected from the environment through a closely coupled CIG, downstream to a spray forming device. The '566 patent similarly discloses an apparatus combining an ESR device closely coupled to a CIG, but further discloses techniques for controlling the flow of molten material through the CIG. The techniques include, for example, controlling the rate of induction heat supplied to the alloy within the CIG, and controlling the rate of heat removal from the molten material within the CIG, through the cold finger apparatus itself and through an adjacent gas cooling means.

In conventional fluid impingement atomization techniques, either a gas or a liquid is impinged on a stream of a molten material. Impingement using liquid or certain gases introduces contaminants into the atomized material. Also, given that fluid impingement does not occur in a vacuum environment, even impingement techniques using inert gases can introduce significant impurities into the atomized material. To address this, certain non-fluid impingement atomization techniques that may be conducted in a vacuum environment have been developed. These techniques include atomization processes described in U.S. Pat. No. 6,772,961 B2, entitled "Methods and Apparatus for Spray Forming, Atomization and Heat Transfer" ("the '961 patent"), wherein molten alloy droplets or a molten alloy stream produced by a melting means coupled with a controlled dispensing means are rapidly electrostatically charged by applying a high voltage to the droplets at a high rise rate. The electrostatic forces set up within the charged droplets cause the droplets to break up or atomize into smaller secondary particles. In one technique described in the '961 patent, primary molten droplets produced by the nozzle of a dispensing means are treated by an electric field from a ring-shaped electrode adjacent to and downstream of the nozzle. Electrostatic forces developed within the primary droplets exceed the surface tension forces of the particles and result in formation of smaller secondary particles. Additional ring-shaped field-generating electrodes may be provided downstream to treat the secondary particles in the same way, producing yet smaller molten particles. The entire disclosure of the '961 patent is hereby incorporated herein by reference.

Electron beam atomization is another non-fluid impingement technique for atomizing molten material, and is conducted in a vacuum. In general, the technique involves using an electron beam to inject a charge into a region of a molten alloy stream and/or a series of molten alloy droplets. Once the region or droplet accumulates sufficient charge the Rayleigh limit, the region or droplet becomes unstable and is disrupted into fine particles (i.e., atomizes). The electron beam atomization technique is described generally in the '961 patent, and is further described below.

The '961 patent also discloses techniques using electrostatic and/or electromagnetic fields to control the acceleration, speed, and/or direction of molten alloy particles formed by atomization in the process of producing spray formed preforms or powders. As described in the '961 patent, such techniques provide substantial downstream control of atomized material and can reduce overspray and other material wastage, improve quality, enhance the density of solid preforms made by spray forming techniques, and improve powder quality and yield when atomizing material to a powder form.

In connection with collecting atomized powders, the method of letting atomized powders settle on the bottom of an atomization chamber is known and has been routinely used commercially in the manufacture of alloy powders. Also, methods of collecting atomized materials as unitary preforms, such as, for example, spray forming and nucleated casting, are well known and have been described in numerous articles and patents. With respect to nucleated casting, specific reference is drawn to U.S. Pat. Nos. 5,381,847, 6,264, 717, and 6,496,529 B1. In general, nucleated casting involves atomizing a molten alloy stream and then directing the resultant particles into a casting mold having a desired shape. The droplets coalesce and solidify as a unitary article in the shape of the mold, and the casting may be further processed into a desired component. Spray forming involves directing atomized molten material onto a surface of, for example, a platen or a cylinder to form a free-standing preform. Characteristically, the typical solids fraction of the atomized particles differs between spray forming and nucleated casting since, for example, a less fluid and mobile particle is necessary in the mold-less spray forming process.

As noted above, many of the known processes for melting, atomizing and forming alloys to produce powders and solid preforms have deficiencies. Such deficiencies include, for example, the existence of oxides and other contaminants in the final product, yield losses due to overspray, and inherent size limitations. Accordingly, there is a need for improved methods and apparatus for melting and atomizing alloys and forming powders and solid preforms from the atomized materials.

SUMMARY

One aspect of the present disclosure is directed to a novel apparatus for forming one of powder and a preform of an alloy. The apparatus includes a melting assembly, an atomizing assembly, a field generating assembly, and a collector. The melting assembly is adapted to produce at least one of a stream and a series of droplets of a molten alloy, and may be substantially free from ceramic in regions contacted by the molten alloy. The atomizing assembly impinges electrons on molten alloy from the melting assembly and thereby atomizes the molten alloy and produces molten alloy particles. The field generating assembly generates at least one of an electrostatic field and an electromagnetic field in a region between the atomizing assembly and the collector. The at least one field interacts with the molten alloy particles and influences at least one of the acceleration, speed, and direction of the molten alloy particles as they pass to the collector. The apparatus optionally further includes a chamber enclosing at least part of the melting assembly, atomizing assembly, a field generating assembly, and a collector, and a vacuum device provides vacuum to the chamber.

An additional aspect of the present disclosure is directed to an apparatus that may be used to form at least one of a powder and a preform. The apparatus includes a melting assembly providing at least one of a stream of molten alloy and a series of droplets of molten alloy, wherein the melting assembly may be substantially free from ceramic in regions contacted by the molten alloy. An atomizing assembly of the apparatus impinges electrons on molten alloy from the melting means to thereby atomize the molten alloy and produce molten alloy particles. A field generating assembly of the apparatus produces at least one of an electromagnetic field and an electrostatic field in a region of the apparatus downstream of the atomizing assembly. The at least one field interacts with and influences the molten alloy particles. In certain non-limiting embodiments of the apparatus, the at least one field generated by the field generating assembly influences at least one of the acceleration, speed, and direction of the molten alloy particles. In addition to a melting assembly, an atomizing assembly, and a field generating assembly, the apparatus optionally further includes at least one of a collector into which the molten alloy particles from the atomizing assembly are directed under influence of the at least one field, and a vacuum chamber enclosing at least part of the melting assembly, atomizing assembly, and field generating assembly.

Yet another aspect of the present disclosure is directed to a method of forming one of a powder and a solid perform. The method includes producing at least one of a stream of molten alloy and a series of droplets of molten alloy in a melting assembly that is substantially free from ceramic in regions of the melting assembly contacted by the molten alloy. The method further includes generating particles of the molten alloy by impinging electrons on molten alloy from the melting device, thereby atomizing the molten alloy and producing molten alloy particles. The method also includes producing at least one of an electrostatic field and an electromagnetic field, wherein the particles of the molten alloy interact with and are influenced by the field. The molten alloy particles are collected in or on a collector as one of a powder and a solid preform. In certain non-limiting embodiments of the method, the particles of molten alloy interact with and are influenced by the at least one field generated by the field generating assembly such that at least one of the acceleration, speed, and direction of the particles of molten alloy is affected in a predetermined manner.

The reader will appreciate the foregoing details, as well as others, upon considering the following detailed description of certain non-limiting embodiments of apparatus and methods according to the present disclosure. The reader also may comprehend such additional details upon carrying out or using the apparatus and methods described herein.

BRIEF DESCRIPTION OF THE DRAWINGS

The features and advantages of apparatus and methods described herein may be better understood by reference to the accompanying drawing in which:

FIGS. 14-16 schematically illustrate several non-limiting embodiments of techniques that may be used to collect solidified atomized material produced by embodiments of apparatus constructed according to the present disclosure.

DESCRIPTION OF CERTAIN NON-LIMITING EMBODIMENTS

In the present description of embodiments and in the claims, other than in the operating examples or where otherwise indicated, all numbers expressing quantities or characteristics of ingredients and products, processing conditions, and the like are to be understood as being modified in all instances by the term "about". Accordingly, unless indicated to the contrary, any numerical parameters set forth in the following description and the attached claims are approximations that may vary depending upon the desired properties one seeks to obtain in the alloys and articles according to the present disclosure. At the very least, and not as an attempt to limit the application of the doctrine of equivalents to the scope of the claims, each numerical parameter should at least be construed in light of the number of reported significant digits and by applying ordinary rounding techniques.

Any patent, publication, or other disclosure material, in whole or in part, that is said to be incorporated by reference herein is incorporated herein only to the extent that the incorporated material does not conflict with existing definitions, statements, or other disclosure material set forth in this disclosure. As such, and to the extent necessary, the disclosure as set forth herein supersedes any conflicting material incorporated herein by reference. Any material, or portion thereof, that is said to be incorporated by reference herein, but which conflicts with existing definitions, statements, or other disclosure material set forth herein is only incorporated to the extent that no conflict arises between that incorporated material and the existing disclosure material.

Figure 1:
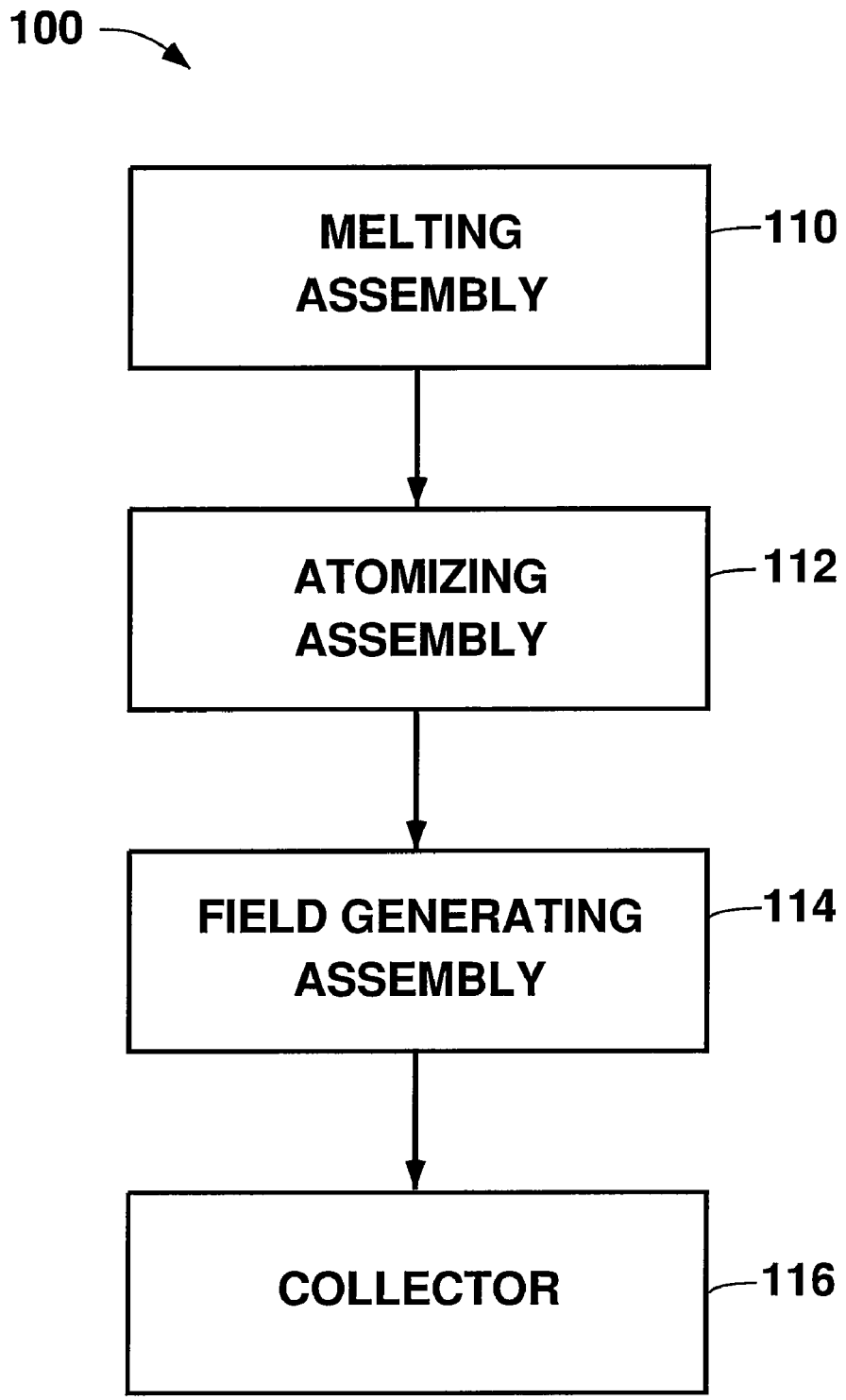
FIG. 1 is a schematic representation of one embodiment of an apparatus constructed according to the present disclosure.

The present invention provides methods and apparatus for enhancing the production of powders and solid preforms by processes including atomization of an alloy. In general, as illustrated in the schematic of FIG. 1, certain embodiments of an apparatus according to the present disclosure, referenced as 100 in FIG. 1, include: a melting assembly (also referred to herein as a "melting device") 110 that produces at least one of a stream and a series of droplets of molten alloy; an electron beam atomizing assembly (also referred to herein as an "atomizing device") 112 that atomizes molten alloy from the melting assembly 110 and produces small molten alloy particles; a field generating assembly (also referred to herein as a "field generating device") 114 that generates at least one of an electrostatic and an electromagnetic field and influences at least one of the acceleration, speed, and direction of one or more of the molten alloy particles produced by the atomizing assembly 112; and a collector 116 that receives molten alloy particles. Also, in general, certain embodiments of a method according to the present disclosure comprise: producing a stream of molten alloy and/or a series of droplets of molten alloy in a melting assembly that is substantially free from ceramic in regions of the melting assembly contacted by the molten alloy; generating molten alloy particles in an atomizing assembly by impinging electrons on molten alloy from the melting assembly; generating at least one of an electrostatic field and an electromagnetic field, wherein molten alloy particles from the atomizing assembly interact with the field, and the field influences at least one of the acceleration, speed, and direction of the molten alloy particles; and collecting the molten alloy particles in a collector as a powder and/or as a preform.

As used herein, the terms "melting assembly" and "melting device" refer to a source of a stream and/or a series of droplets of a molten alloy, which may be produced from a charge of starting materials, scrap, an ingot, or another source of the alloy. The melting assembly or device is in fluid communication with and feeds molten alloy to an atomizing assembly or device. The melting assembly substantially lacks ceramic material in regions of the assembly that are contacted by the molten material. As used herein, the phrase "substantially lacks ceramic" and the like means that ceramic either is absent in regions of the melting assembly that the molten material contacts during operation of the assembly, or is present in regions of the melting assembly that do contact the molten alloy during normal operation but in a way that does not result in the inclusion of problematic amounts or sizes of ceramic particles or inclusions in the molten alloy.

It is important to prevent or substantially limit contact between the molten material and ceramic material in the melting assembly because ceramic particles can "wash out" of the ceramic linings and mix with the molten alloy. The ceramic particles will have a higher melting point than the molten material and may be incorporated into the cast product. Once incorporated into the final product, the ceramic particles can fracture and initiate cracks in the product during low cycle fatigue. Once initiated, cracks can grow and result in product failure. Thus, depending on the intended application for the cast material, there may be little or essentially no allowance for the presence of ceramic particles in the material. In conventional cast and wrought metallurgy, ceramic particles from the vacuum induction melting (VIM) step can be essentially removed during the subsequent vacuum arc remelting (VAR) step or, when using conventional triple-melt practice, during the electroslag remelting (ESR) plus VAR steps. Cleanliness achieved using various practices can be evaluated using a semi-quantitative test known as the "EB button" test, wherein a sample electrode of the material to be evaluated is electron beam melted in a crucible and the resulting floating raft of oxide is measured for the largest oxide present. In conventional powder metallurgy, the powder is consolidated into product after melting and there is no means of further refining the product to remove the oxides. Instead, the powder is sieved and the largest fraction of powder that is made into product is that which is equivalent to the smallest defect that the part designers use in their design criteria. In the design of the most critical aircraft engine parts from consolidated powder metals, for example, the smallest modeled defect is approximately 44 microns and, thus, powders having a sieve size no larger than this are used. For less critical aircraft engine parts, the smallest modeled defect could be as large as approximately 149 microns and, thus, powders having a sieve size no larger than this are used.

Examples of melting techniques that do not introduce ceramic inclusions that may be included in an apparatus and used in a method according to the present disclosure include: melting devices comprising vacuum double-electrode remelting devices; melting devices comprising the combination of either an electroslag remelting device or a vacuum arc remelting device and a cold induction guide; electron beam melting devices; and electron beam cold hearth melting devices. However, keeping in mind that an objective of the design of the particular melting assembly used is to prevent or limit to an acceptable degree any contact between the molten material and any ceramics included in the assembly, other melting assemblies that may be used in methods and apparatus according to the present disclosure will be apparent to those having ordinary skill.

As used herein, the term "alloy" refers both to pure metals and to alloys. Thus, as non-limiting examples, "alloy" includes, for example, iron, cobalt, nickel, aluminum, titanium, niobium, zirconium, copper, tungsten, molybdenum, tantalum, and alloys of any of these metals, stainless steels, and nickel-base and cobalt-base superalloys. Particular non-limiting examples of nickel-base superalloys that may be processed using methods and apparatus according to the present disclosure include IN 100 (UNS 13100), Rene 88, Alloy 720, Alloy 718 (UNS N07718), and 718Plus™ alloy (UNS N07818) (available from ATI Allvac, Monroe, N.C.). Particular non-limiting examples of titanium alloys that may be processed using methods and apparatus according to the present disclosure include Ti-6Al-4V, T-17, Ti-5-5-5-3, and TiAl alloys.

As used herein, the term "atomizing assembly" refers to an apparatus that impinges at least one stream of electrons (i.e., an electron beam) or a field of electrons on molten alloy from the melting assembly. As just used, "impinges" means to bring into contact. In this way, the electrons imparts a charge to the impinged region of the stream and/or to the individual molten alloy droplets. As discussed in the '961 patent and below, once the charge in a droplet or a particular region of a stream reaches a sufficient magnitude, the region or droplet becomes unstable and is disrupted (atomized) into small molten alloy particles. (As used herein, "molten alloy particles" refers to particles that include some content of molten material, but which are not necessarily entirely molten.) Such an atomizing apparatus may be variously referred to herein as an electron beam atomizing assembly, apparatus, device, or the like.

Essentially, as discussed in the '961 patent, a fundamental feature of an electron beam atomizing apparatus is that it is designed to rapidly apply an electrostatic charge to a stream or droplets of molten alloy. The apparatus is adapted so that the electrostatic charge imparted to the molten alloy physically disrupts the stream or droplet and produces one or more small molten alloy particles from the molten alloy, thereby atomizing the material. Atomization of molten material using rapid electrostatic charging through impingement by electrons results in the rapid breakup of the material into small particles due to electrostatic repulsion forces set up within the material. More specifically, the region or droplet of molten alloy is rapidly electrostatically charged beyond the "Rayleigh limit", such that the electrostatic forces within the region or droplet exceed the surface tension of the material and the material breaks up into small particles. The Rayleigh limit is the maximum charge a material can sustain before the electrostatic repulsions set up within the material exceed the surface tension holding the material together. Advantages of an atomization technique utilizing the impingement of electrons on a material to set up electrostatic charge repulsion with the material include the capability to conduct the technique within a vacuum environment. In this way, chemical reactions between the atmosphere or an atomizing fluid with the molten material can be limited or eliminated. This capability contrasts with conventional fluid atomization, wherein the material being atomized necessarily contacts the atomizing gas or liquid and is typically conducted in ambient air or in inert gas for titanium-base and nickel-base alloys.

The stream or droplets atomized by the atomizing assembly is produced by the upstream melting assembly. The melting assembly may include, for example, a dispenser for forming a suitable stream or droplets. In certain non-limiting embodiments, such as those disclosed in the '961 patent, the dispenser may include a melt chamber having an orifice. The stream and/or droplets are forced or otherwise emerge from the orifice and pass downstream to the atomizing assembly. In certain non-limiting embodiments, the molten alloy stream or droplets emerge from the orifice of a melt chamber under the influence of mechanical action or pressure. In one possible embodiment, pressure is applied to the molten alloy in a dispenser of a melting assembly in a magnitude greater than the pressure on the outside of the dispenser to produce molten alloy droplets at an orifice in the dispenser. Also, in one embodiment the pressure may be varied so as to selectively interrupt the flow of the molten alloy droplets.

Certain non-limiting embodiments of the melting assembly may be designed to "pre-charge" the molten metal stream or droplets presented to the atomizing assembly with a negative charge. Pre-charging the stream or droplets would reduce the amount of negative charge required from the electron beam atomizing assembly to atomize the stream or droplets into small particles. One possible technique for pre-charging is to maintain the melt assembly at a high negative potential relative to other elements of the apparatus. This can be accomplished by electrically isolating the melt assembly from other elements of the apparatus, and then raising the negative potential of the melting assembly to a high level using a power supply electrically coupled to the melting assembly. An alternative pre-charging technique is to position an induction ring or plates upstream of the atomizing assembly in a position close to the exit orifice of the melting assembly. The ring or plates, or perhaps other structures, are adapted to induce a negative charge in the droplets or stream passing a short distance downstream to the atomizing assembly. The atomizing assembly would then impinge electrons on the pre-charged material to further negatively charge and atomize the material. Other pre-charging techniques will be apparent upon considering the present disclosure.

In certain embodiments of the atomizing assembly according to the present disclosure, charge is imparted to the molten alloy stream and/or droplets by way of a thermionic emission source or a like device. As is known in the art, the thermionic emission phenomenon, at one time known as the "Edison effect", refers to the flow of electrons (referred to as "thermions") from a metal or metal oxide surface when thermal vibrational energy overcomes the electrostatic forces holding electrons to the surface. The effect increases dramatically with increasing temperature, but is always present to some degree at temperatures above absolute zero. A thermionic electron gun utilizes the thermionic emission phenomenon to produce a stream of electrons with a well defined kinetic energy. As is known in the art, thermionic electron guns generally comprise (i) a heated electron-producing filament, and (ii) an electron accelerating region, which is bounded by a cathode and an anode. The filament typically consists of a piece of refractory material wire, which is heated by passing an electric current through the filament. Suitable thermionic electron gun filament materials have the following properties: low potential barrier (work function); high melting point; stability at high temperatures; low vapor pressure; and chemical stability. Certain embodiments of thermionic electron guns include, for example, tungsten, lanthanum hexaboride ($LaB_6$), or cerium hexaboride ($CeB_6$) filaments. Electrons "boil away" from the surface of the filament upon application of sufficient thermal energy generated by the applied current, but electrons produced in this way have very little energy. To address this, a positive electrical potential is applied to the anode. The electrons produced at the filament drift through a small hole in the cathode, and the electric field in the region between the anode and the positively charged cathode accelerates the electrons across the gap to the anode, where they pass through a hole in the anode with a final energy corresponding to the applied voltage between the electrodes. Thermionic electron guns are commercially available and their construction and manner of operation are well known.

In order to negatively charge the droplets or stream to a level necessary to overcome surface tension and atomize the material, the droplets or stream must be subjected to a flow or field of electrons of sufficient energy and intensity for a finite period of time. Thus, the atomizing assembly preferably produces a "linear" electron field, which extends a suitable distance along the path traveled through the atomizing assembly by the droplets or stream. A linear electron field, wherein the electrons are spatially distributed, may be contrasted with a point source electron beam emitter, wherein the electrons are focused in a narrow beam. Spatial distribution of the electrons may be important in the apparatus of the present disclosure given that the droplets or stream of molten material introduced to the atomizing assembly is moving through the assembly under the influence of gravity.

Without intending to be bound to any particular theory, it appears that electron beam atomized particles may be formed from a molten droplet or stream by one or both of the following mechanisms. In a first possible mechanism, new atomized particles are sequentially stripped from the surface of the droplet or stream as negative charge is added to the droplet or stream. Another possible mechanism is that atomized particles are formed by a cascading effect in which the initial molten stream or droplet breaks up into small particles, the particles are recharged to negative potential and break up into yet smaller particles, and the process repeats during the time in which electrons are added to the successively smaller atomized particles. Under either mechanism, the molten material must be exposed to the electron field for a sufficient time so that sufficient negative charge accumulates in and disrupts the material. One possible spatial distribution of electrons within the electron field generated in the atomizing assembly is in the form of a cylinder of electrons. The longitudinal axis of the cylinder is oriented in the general direction of travel of the molten material through the atomizing assembly. The minimum length of the cylinder (along the longitudinal axis) required for complete atomization will depend on the time it takes the free falling molten material to be atomized by the electron field given the energy and intensity of the electron field within the cylinder. Non-cylindrical electron field shapes also may be used, such as, for example, fields having a transverse cross-section (transverse to the molten material's general direction of travel through the atomizing assembly) that is rectangular, triangular, or some other polygonal or otherwise bounded shape. More generally, however, fields of any combination of energy, intensity, and three-dimensional shape capable of suitably atomizing the molten material may be used. Non-limiting prophetic embodiments of an electron beam atomizing assembly for an apparatus constructed according to the present disclosure are discussed below.

According to one possible non-limiting embodiment of an atomizing assembly according to the present disclosure, a source of electrons having sufficient energy to atomize the molten droplets or stream is provided. The electron source may be, for example, a heated tungsten filament. The electrons stripped from the tungsten filament are manipulated using electrostatic and/or electromagnetic means to form a beam of electrons having a cross-section that is in the form of a rectangle with a large aspect ratio (the ratio of beam width to beam length). The rectangular-shaped beam is then projected into the atomizing chamber as a generally block-shaped field across the path of travel of the molten material. FIG. 2 schematically illustrates this arrangement, wherein atomizing assembly 210 includes tungsten filament 212 that is heated by flow of current from power supply 214. Heated filament 212 generates free electrons 216. The electrons may be generated in this way using, for example, a thermionic electron beam emitter. The electrons are shaped by an electrostatic field generated by plates 220 to form a generally rectangular-shaped electron beam 222. The electron beam 222 is projected into the interior of the atomizing assembly 210 to produce a generally block-shaped electron field 226. Molten metal droplets 230 dispensed from the upstream melting assembly 232 pass through the electron field 226 and are atomized to smaller particles 238 through disruption by accumulation of negative charge. The atomized particles 238 pass in the direction of arrow A toward a collector (not shown).

Possible alternative electron generating devices that may be used to produce electrons in certain embodiments of atomizing assemblies according to the present disclosure are cold cathode wire ion generators and plasma ion emitters. Cold cathode wire ion emitters typically produce an electron field having a generally rectangular cross-section. One advantage of a cold cathode ion generator is that it produces an electron emission at temperatures lower than a thermionic electron generator. The design of both cold cathode wire ion generators and plasma ion emitters, and their manner of operation to produce electrons, are generally known in the art. Therefore, further description of such devices is not provided herein. Electrons produced by the particular electron-generating device or devices within the atomizing assembly may be suitably manipulated, such as using electromagnetic and/or electrostatic fields, to form a beam of electrons having a suitable cross-section. The electron beam may then be projected into the atomizing chamber across the path of travel of the molten material.

Figure 3:
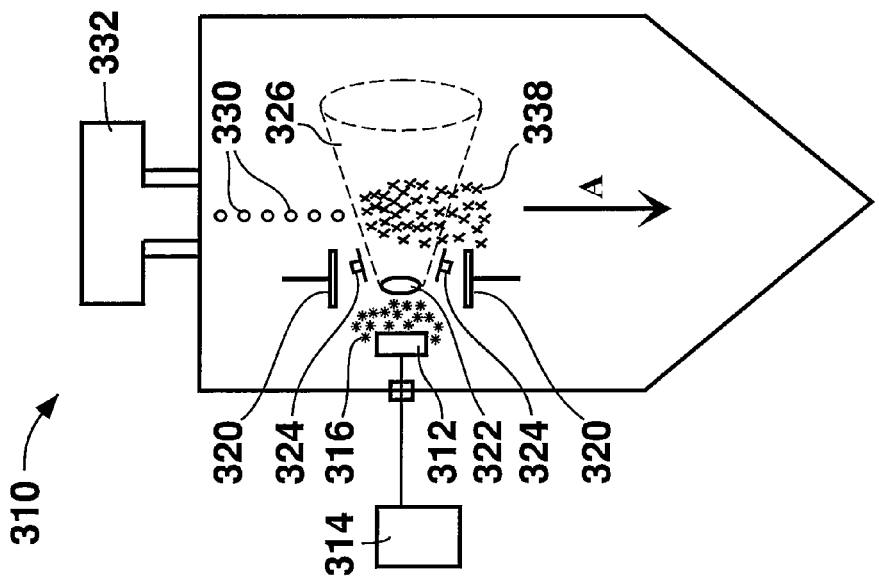
FIG. 3 is a schematic representation of aspects of one non-limiting embodiment of an apparatus constructed according to the present disclosure, wherein a rastering apparatus generates a field of electrons in the pathway of molten material passing through the atomizing assembly.

FIG. 3 illustrates an additional non-limiting embodiment of an atomizing assembly 310 according to the present disclosure. One or more tungsten filaments 312 are heated by power supply 314 and produce electrons 316 having sufficient energy to atomize molten metal when impinged on the molten metal in sufficient quantities. The electrons may be generated in this way using, for example, a thermionic electron beam emitter. The electrons 316 are manipulated by structures such as, for example, plates 320 to form a diffuse spot 322. Rastering apparatus 324 rasters the electron spot 322 at a high raster rate within the region of the atomizing assembly through which the molten material passes under the influence of gravity. The effect of the high raster rate is to provide a three-dimensional electron field 326 having a controlled shape in the atomizing chamber of the atomizing assembly 310 that is large enough to completely or substantially completely atomize the molten metal droplets 330 introduced by the melting assembly 332 to smaller atomized particles 338. The atomized particles 338 pass in the direction of arrow A to a collector (not shown).

Figure 4:
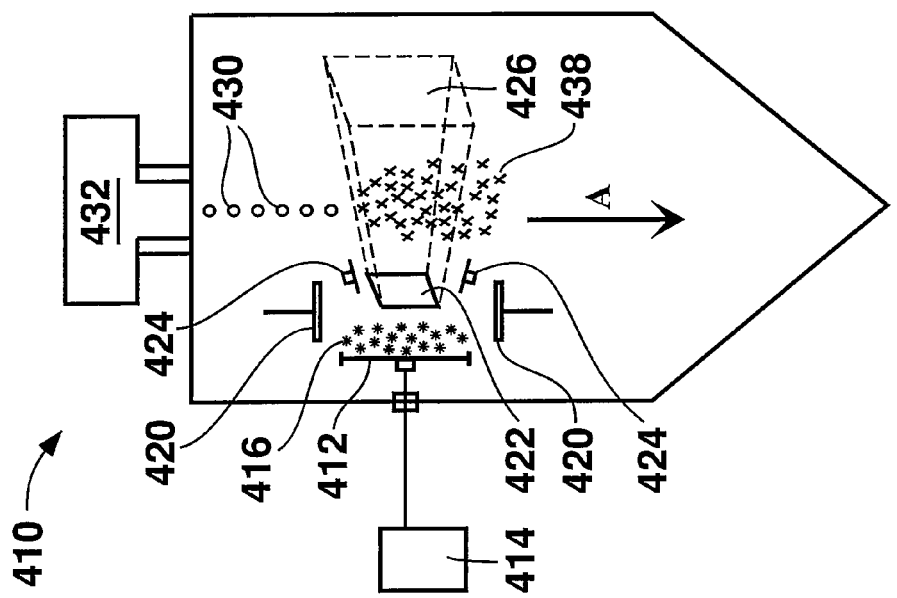
FIG. 4 is a schematic representation of aspects of one non-limiting embodiment of an apparatus constructed according to the present disclosure, wherein a electrons used to produce an electron field in the pathway of molten material passing through the atomizing assembly are generated from the outer surface of a filament.

A further embodiment of an atomizing assembly useful in an apparatus according to the present disclosure is shown in FIG. 4. Atomizing assembly 410 produces an electron field having a large generally rectangular cross section. The electrons are generated from the surface of a generally straight length of tungsten filament 412 heated by power supply 414. This means of generating electrons contrasts with the technique of generating electrons from a point source, as is typically done in electron beam guns. The electrons 416 emanating from the surface of the filament 412 may be manipulated using electrostatic or electromagnetic fields, such as, for the example, the electromagnetic field generated by plates 420, to form a beam 422 having a generally rectangular cross section. The rectangular electron beam 422 may be rastered at a high raster rate by a rastering apparatus into the atomizing assembly 410 to form an electron field through which molten material 430 sourced from melting assembly 432 passes. Alternatively, as shown in FIG. 4, the rectangular electron beam 422 may be projected into the atomizing assembly 410 by projecting device 424 to form an electron field 426, having a generally rectangular cross section, through which molten material 430 sourced from melting assembly 432 passes. The material 430 is disrupted by accumulation of negative charge into atomized particles 438, which pass to a collector (not shown) in the direction of arrow A.

To provide sufficient electrons to suitably atomize molten material, any of the foregoing embodiments may be modified to include multiple sources of electrons at suitable positions within the atomizing assembly. Multiple means for manipulating and projecting/rastering the electrons also may be utilized to generate a suitable electron field. For example a number of thermionic or non-thermionic electron beam emitters or other electron sources may be oriented at specific angular positions (for example, three at 120 degrees to one another) about the pathway of the molten material in the atomizing chamber and generate a three-dimensional field of electrons by projecting the electrons from the multiple sources into the pathway.

Figure 2:
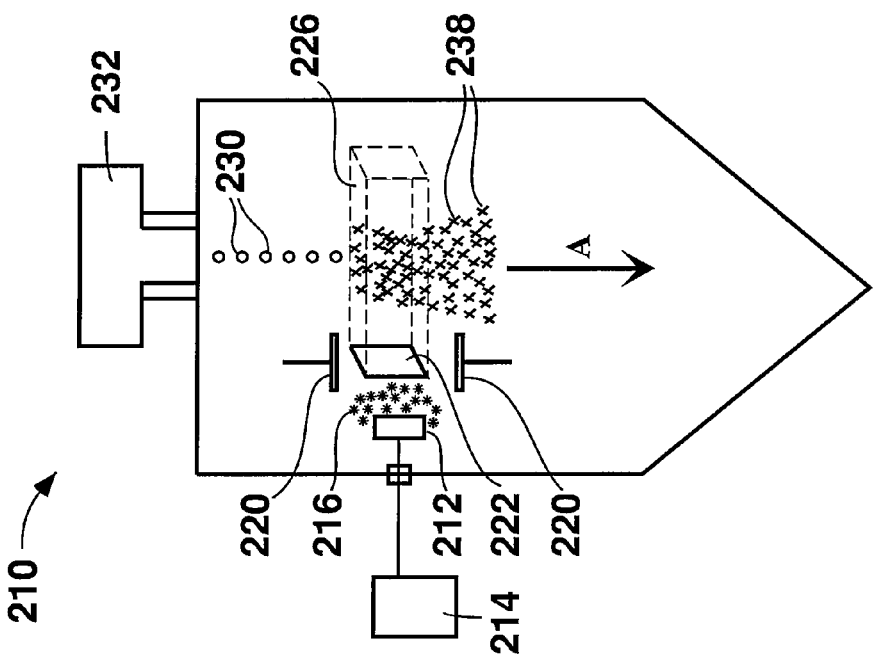
FIG. 2 is a schematic representation of aspects of one non-limiting embodiment of an apparatus constructed according to the present disclosure, wherein a generally block-shaped field of electrons is generated in the pathway of molten material passing through the atomizing assembly.

Also, aspects of the several atomizing assembly embodiments described above could be combined. For example, in one alternate embodiment combining aspects of the embodiments shown in FIGS. 2 and 3, the rectangular beam 222 of the atomizing assembly 210 is rastered using the rastering apparatus 324 in atomizing assembly 310 to produce an electron field to atomize the molten material. Relative to electron spot 322, rastering the relatively high aspect ratio rectangular electron beam 222 may provide larger linear coverage along the path of the molten material in the atomizing chamber.

In certain embodiments of an electron beam atomizing assembly included in an apparatus according to the present disclosure, a first flow or stream of electrons is impinged on material emerging from the melting assembly, thereby atomizing the material to primary molten alloy particles having a first average size. Impinging a second stream of electrons on the primary particles further atomizes the particles to a smaller average particle size. Further reductions in average size may be achieved by impinging additional electron flows or streams on the atomized particles. In this way, several size refinements are possible using rapid electrostatic charging by impingement of electrons. In certain embodiments, rapid electrostatic charging by an electron beam is applied two, three, or more times along a pathway to achieve a final desired average molten material particle size. In this way, the original size of molten alloy droplets produced by the melting assembly need not limit the size of the final atomized particles produced in the atomizing assembly. The multiple electron sources in such an arrangement may be, for example, individual thermionic electron beam emitters, including linear thermionic electron beam emitters.

Figure 5:
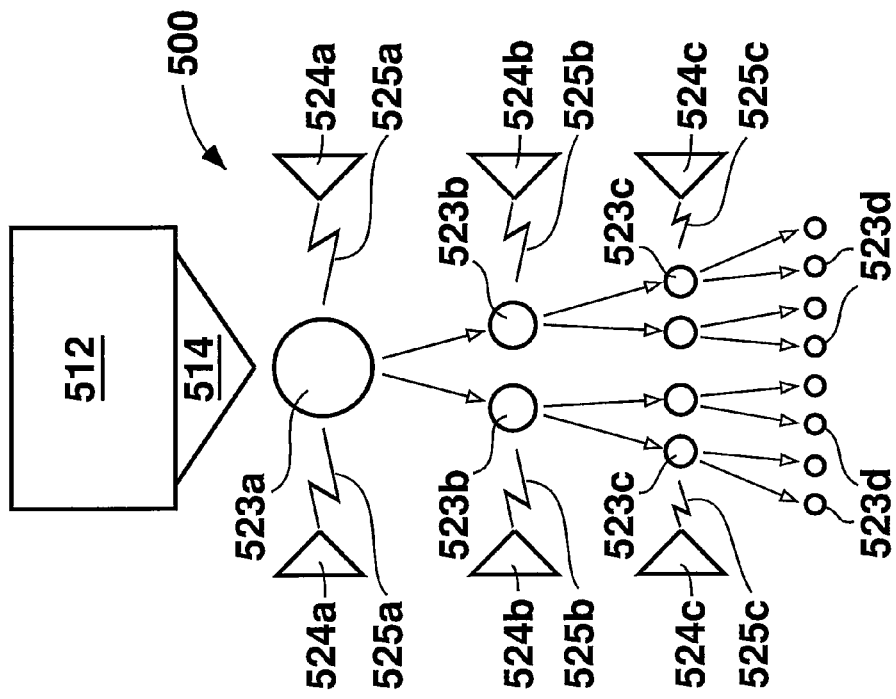
FIG. 5 is a schematic representation of one embodiment of an electron beam atomizing assembly that may be included in an apparatus constructed according to the present disclosure.

Accordingly, in certain non-limiting embodiments of an atomizing assembly according to the present disclosure, a droplet or a portion of a stream of molten alloy undergoes two or more stages of atomization to successively reduce the average the size of the resulting atomized particles. This may be accomplished, for example, by appropriately positioning two or more electron guns or other sources of flows or streams of electrons along a pathway in a region between the atomizing assembly and the collector. An atomizing assembly having this general construction is schematically illustrated as assembly 500 in FIG. 5. A melting assembly 512 includes a dispenser 514 that produces a molten alloy droplet 523a. The dispenser 514 may use, for example, mechanical means or pressure to produce the molten alloy droplet 523a from molten material produced from an ingot, charge, scrap, or other source in the melting assembly 512. Primary electron beam guns 524a generate streams of electrons 525a that impinge on droplet 523a and impart a negative charge to the droplet. The electrostatic forces set up within the droplet 523a eventually exceed the droplet's surface tension energy, disrupting the droplet and forming primary molten alloy particles 523b. Secondary electron beam guns 524b focus streams of electrons 525b on primary molten alloy particles 523b, similarly imparting negative charge to the particles and disrupting them into smaller secondary molten alloy particles 523c. Tertiary electron beam guns 524c focus streams of electrons 525c on secondary molten alloy particles 523c, also imparting negative charge to the particles and disrupting them into yet smaller tertiary molten alloy particles 523d. In one embodiment of this arrangement, the several electron beam guns are thermionic electron guns, although any other suitable device for generating suitable streams of electrons may be used.

As discussed in the '961 patent, "rapid" electrostatic charging refers to charging to a desired magnitude within about 1 to about 500 microseconds, preferably about 1 to about 100 microseconds, and more preferably about 1 to about 50 microseconds. The rapid electrostatic charging of molten alloy produced by the melting assembly produces charges exceeding the Rayleigh limit of the material, and thereby produces a plurality of molten alloy particles. The particles, for example, may have a generally uniform diameter of, for example, about 5 to about 2500 microns, more preferably about 5 to about 250 microns.

Accordingly, the atomizing assembly generates molten alloy particles, which are further processed in the apparatus to form either a powder or a monolithic (i.e., one-piece) preform. As used herein, the term "preform" refers to any casting, workpiece, or other article that is formed by collecting together molten alloy particles. In the apparatus and method of the present disclosure, all or a portion of the molten alloy particles produced by the atomizing assembly are controlled downstream of the atomizing assembly and collected in a collector. More specifically, apparatus according to the present disclosure include at least one field generating assembly that generates an electrostatic field and/or an electromagnetic field that is at least partially present in a region downstream of the atomizing assembly. The electrostatic field and/or electromagnetic field generated by the field generating assembly is structured and/or manipulated so as to influence at least one of the acceleration, speed, direction of the molten alloy particles that interact with the field.

As used herein, the term "field generating assembly" refers to an apparatus that generates and, optionally, manipulates, one or more electrostatic and/or electromagnetic fields that may be used to control at least one of the acceleration, speed, direction of molten alloy particles in a region downstream of the atomizing assembly. Embodiments of field generating assemblies are described in U.S. Pat. No. 6,722,961 B2, which has been incorporated herein by reference.

As used herein, "electrostatic field" can refer to a single electrostatic field or a plurality of (two or more) electrostatic fields. An electrostatic field may be generated by, for example, charging a point, plate, or other source to high potential. Also as used herein, "electromagnetic field" can refer to a single electromagnetic field or a plurality of electromagnetic fields. An electromagnetic field may be created by, for example, passing electric current through a conductor.

In certain embodiments of an apparatus and method according to the present disclosure, all or a portion of the molten alloy particles generated by the atomizing assembly and passing within or through the field(s) produced by the field generating assembly are collected in or on a collector as a powder or a preform. As used herein, the term "collector" refers to an apparatus, element, or portion or region of an apparatus or element, or an assemblage of elements, that is adapted to receive or collect all or a portion of the molten alloy particles produced by the atomizing assembly in the form of a powder or a preform. Non-limiting examples of a collector that may be incorporated into embodiments of an apparatus or method according to the present disclosure include the entirety or a portion or region of a chamber, a hopper, a mold, a platen, a mandrel, or a surface. Typically, the collector is at ground potential or, preferably, is at a high positive potential so as to attract the negatively charged atomized particles generated by the atomizing assembly. When the apparatus is adapted to the formation of a powdered material, such as, for example, a powdered steel or other alloy, the collector may be, for example, a chamber, a hopper, or some other suitably configured container. When the apparatus is adapted to spray forming an ingot or other preform, the collector may be, for example, a platen or a mandrel, which may be adapted to rotate or otherwise translate to suitably form a solid article of the desired geometry. When the apparatus is adapted for nucleated casting of a solid article, the collector typically is in the form of a mold including a void having the geometry of the desired cast article.

The general arrangement illustrated in FIG. 1, i.e., an apparatus combining a melting assembly, an atomizing assembly, a field generating assembly, and a collector, may be designed and operated to produce an alloy powder that is retrieved in the collector. In such case, the collector may be, for example, a chamber, hopper, or other container. The combination also may be adapted to conduct spray forming so as to produce an ingot or other solid preform on a surface of the collector, which in such case may be, for example, a platen or a mandrel. The combination may further be designed to conduct nucleated casting to form a solid cast article on or in the collector, which in such case may be, for example, a mold including one or more side walls.

In certain non-limiting embodiments of an apparatus according to the present disclosure designed to conduct spray forming or nucleated casting, for example, the directional assembly generates one or more electrostatic and/or electromagnetic fields that interact with and direct molten alloy particles to various regions of the developing preform at various times during the forming process.

Also, the electrostatic and/or electromagnetic fields can be used to direct molten alloy particles to areas of a developing preform where it is desired to add or remove heat, thereby influencing the macrostructure of the preform. In conducting spray forming or nucleated casting, for example, the shape of the one or more electrostatic and/or electromagnetic fields can also be manipulated to produce near-net shape preforms by directing particles to predetermined regions on the developing preform at various times during the forming or casting process. By employing one or more electrostatic and/or electromagnetic fields using the field generating assembly, it is possible to enhance the yield of the forming or casting process, as well as improve (and control) the density of the resulting preform.

Accordingly, the present disclosure describes methods and apparatus including means for generating one or more electrostatic and/or electromagnetic fields for selectively controlling, for example, one or more of the yield, quality, and density of solid workpieces (preforms) and powders produced from molten material. Methods of directing atomized materials utilizing electrostatic and/or electromagnetic fields in spray forming and powder atomization are expected to provide significantly enhanced yields and to provide solid preforms having densities that are significantly greater than conventionally-formed preforms.

In one embodiment of an apparatus according to the present disclosure, the field generating assembly generates an electrostatic field in a region between the atomizing assembly and the collector by electrically coupling the collector to a high voltage DC power supply and grounding the atomizing assembly. Given that electron beam atomization is used in the present apparatus and method and the atomized particles will be negatively charged, negative polarity is used. The electrostatic field may react with the negatively charged molten alloy particles produced by the atomizing assembly and the particles are influenced to move in the general direction of the electrostatic field lines. This interaction can be used to control one or more of the acceleration, speed, direction of the molten alloy particles toward the collector.

In addition to a high voltage DC power supply, the field generating assembly included in certain embodiments of an apparatus constructed according to the present disclosure can comprise one or more electrodes disposed at suitable positions and in suitable orientations so as to generate suitable field(s) between the atomizing assembly and the collector. The electrodes are positioned and oriented to shape the electrostatic field between the atomizing means and the collector in a desired manner. The electrostatic field provided under the influence of the one or more electrodes can have a shape that directs the molten alloy particles in a desired manner to the collector.

The field generating assembly can also comprise a plurality of high voltage DC power supplies, each attached to one or more electrodes disposed at suitable positions and in suitable orientations between the atomizing assembly and the collector, and that influence the shape of the electrostatic field generated by the field generating assembly between the atomizing assembly and the collector in a time-dependent manner. In this way, the field may be manipulated to suitably direct molten alloy particles generated by the atomizing assembly to specific areas or points on the collector or on the developing preform over time. For example, a field generating assembly including a plurality of electrodes and associated power supplies can be incorporated in an apparatus according to the present disclosure adapted to produce near-net shape solid articles by spray forming. A field generating assembly including a plurality of electrodes and associated power supplies also could be employed to produce solid preforms by spray forming or nucleated casting having high density relative to preforms produced by conventional spray forming and nucleated casting apparatus. In such embodiments, the electrostatic field may be varied in terms of strength and/or shape to suitably direct the particles of molten material to the collector in a manner akin to the relatively crude mechanical rastering movement of the atomizing nozzle in a conventional spray forming or nucleated casting apparatus lacking a field generating assembly.

In another embodiment of an apparatus according to the present disclosure, an electromagnetic field is produced between the atomizing assembly and the collector by one or more magnetic coils positioned intermediate the atomizing assembly and the collector. The magnetic coils are electrically connected to a power supply, which energizes the coils. Molten alloy particles produced by the atomizing assembly are directed along the field lines of the electromagnetic field to the collector. Preferably, the position and/or orientation of the one or more magnetic coils can be adjusted so as to direct the molten particles to specific areas or points on the collector or the developing preform. In this way, molten alloy particles can be directed to enhance the density of preforms or even produce near-net shape preforms during spray forming or nucleated casting.

In yet another embodiment of an apparatus according to the present disclosure, a plurality of magnetic coils is disposed between the atomizing assembly and the collector. The electromagnetic fields generated by the plurality of magnetic coils, which may be singly or multiply energized to different magnetic field intensities, influence the direction of movement of the molten alloy particles produced by the atomizing assembly, directing the particles to specific predetermined areas or points on the collector or on the developing preform. By this arrangement, the molten alloy particles can be directed in predetermined patterns to produce, for example, solid preforms having near-net shape and/or relatively high density. In certain embodiments, the fields generated by the field generating assembly may be used to improve or refine the directional control already available through the use of translatable atomizing nozzles in conventional spray forming and nucleated casting equipment. In certain embodiments, the substantial directional control attainable solely by appropriately manipulating field shape, direction, and/or intensity, can entirely replace the movement of atomizing nozzles in conventional spray casting equipment.

Certain embodiments of an apparatus constructed according to the present disclosure address the possibility of overspray by suitably charging the collector. Atomizing a molten stream and/or molten particles using an electron beam results in particles that are negatively charged due to the excess of electrons within the atomized particles. By suitably charging the collector with a charge of opposite sign to the atomized particles, the collector will attract the particles and thereby significantly reduce or eliminate overspray. Overspray is a problematic drawback of conventional spray forming that can result in significantly compromised process yields Several prophetic embodiments of an apparatus constructed according to the present disclosure are shown in the following figures and described in the text below. These prophetic examples are for the purpose of illustration only, and are not intended to limit the scope of the present disclosure or the appended claims. The intended scope of the invention is better described in the appended claims.

Figure 6:
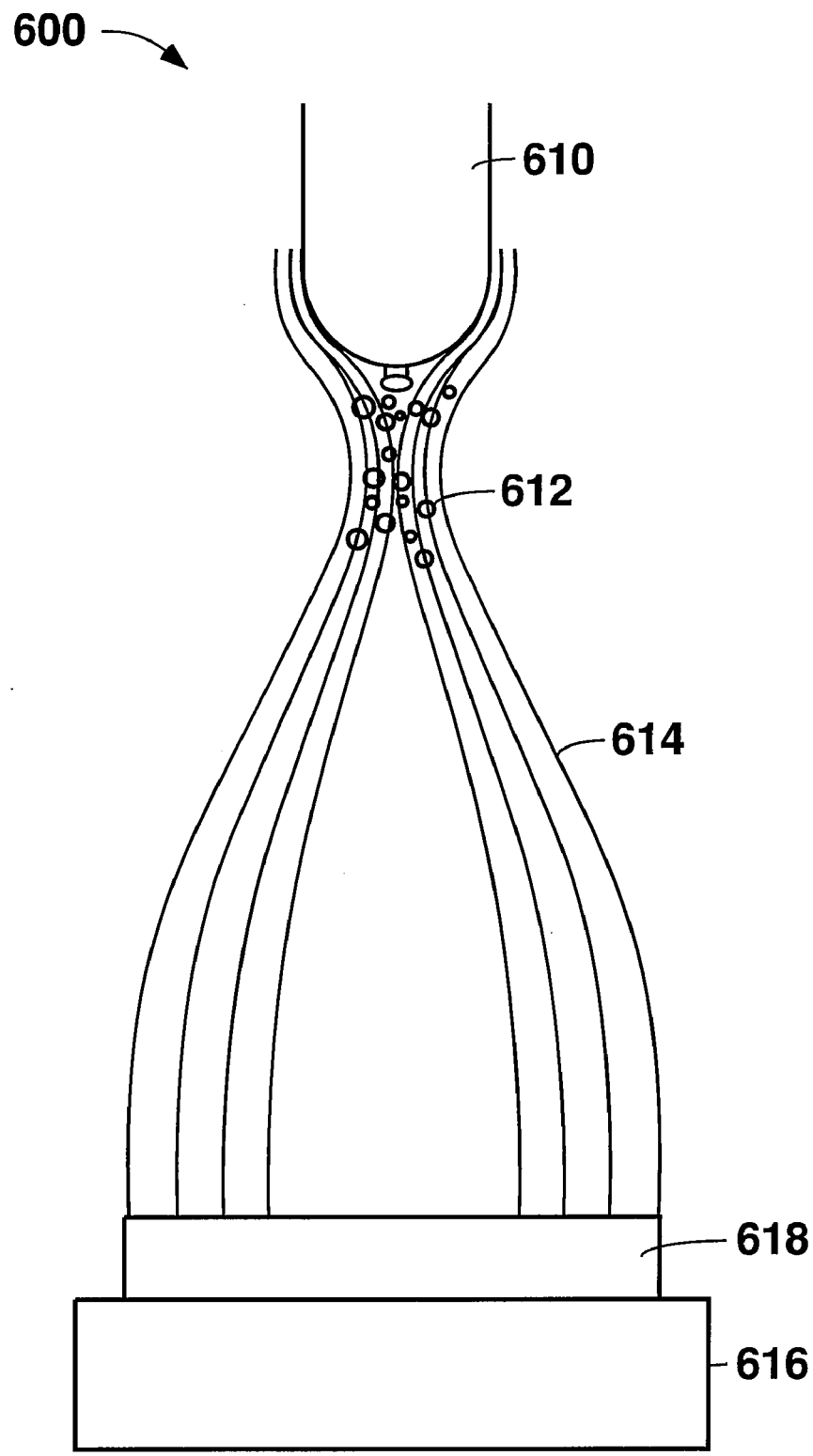
FIGS. 6, 7, 7A, 8, and 8A are schematic representations of elements of different non-limiting embodiments of apparatus constructed according to the present disclosure, adapted for spray forming a preform.

FIG. 6 schematically illustrates certain elements of an embodiment of an apparatus 600 according to the present disclosure that is adapted for spray forming a solid preform. Electron beam atomizing assembly 610 produces negatively charged molten alloy particles 612. An electrostatic field 614 is generated between the atomizing assembly 610 and a collector 616. The atomizing assembly 610 receives at least one of a stream and a series of droplets of molten alloy from a melting assembly (not shown) that is substantially free from ceramic in regions that contact the molten material. The charged molten alloy particles interact with the electrostatic field 614, which accelerates the molten alloy particles 612 toward the collector 616. The molten particles 612 form a solid preform 618 on a surface of the collector 616. The field's influence on speed and/or direction of the molten alloy particles 612 may be used to reduce over-spray from the preform 618, thereby enhancing the yield of the spray forming process, and possibly also increasing the density of the preform 618 relative to a density possible without the use of such a field generating assembly.

Figure 7A:
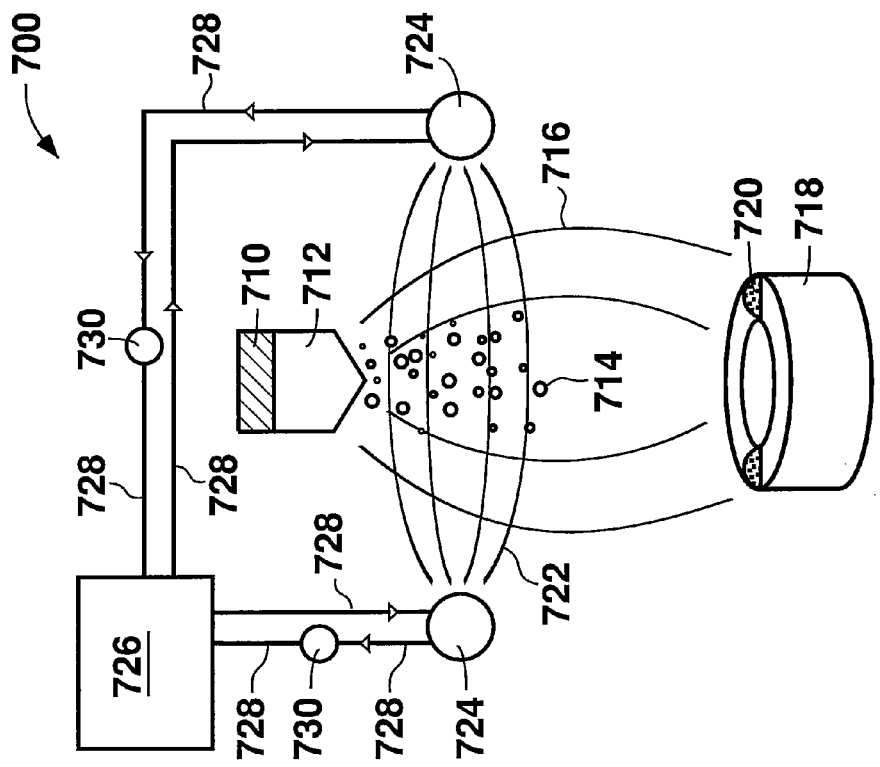
Figure 7:
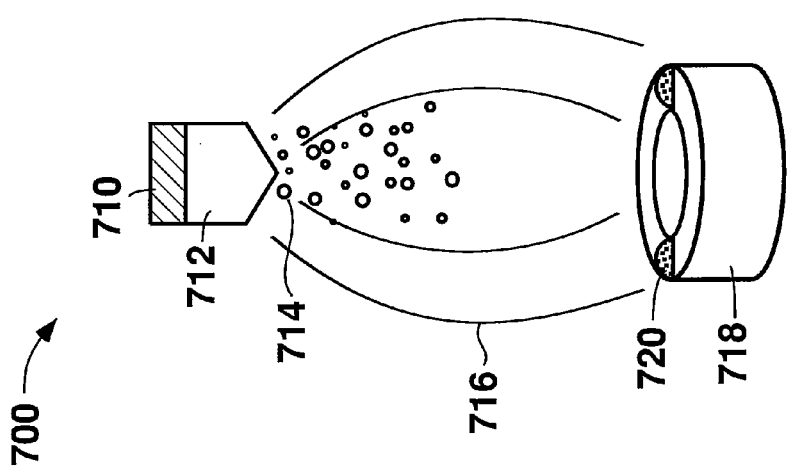

FIG. 7 schematically illustrates certain elements of an additional non-limiting embodiment 700 of an apparatus constructed according to the present disclosure. Melting assembly 710 supplies at least one of a stream and a series of droplets of molten alloy to electron beam atomizing assembly 712, which produces a spray of charged molten alloy particles 714. Electrostatic field 716 is generated by a field generating assembly between the atomizing assembly 712 and a suitably shaped collector 718. The field 716 interacts with the charged molten alloy particles 714 to accelerate the particles 714 toward the collector 718. Particles 714 may be accelerated to a greater extent if the collector 718 is held at a high positive potential. The accelerating force and directional control exerted by field 716 on the charged molten particles 714 may be used to enhance the density of the solid preform 720, and also may be utilized to produce a near-net shape preform 720. The collector 718 may be stationary, or may be adapted to rotate or otherwise suitably translate.

As shown in the alternate embodiment of FIG. 7A, apparatus 700 optionally may be modified to include means for generating a non-equilibrium plasma 722 in the path of the molten particles 714 between two heat sink electrodes 724. The electrodes 724 thermally communicate with an outside thermal mass 726 by way of a dielectric liquid which circulates through conduit 728 under the influence of pumps 730. The thermal coupling between the heat sink electrodes 724 and the outside thermal mass 726 by way of the dielectric fluid allows heat to be removed from the molten particles 714 and communicated to the thermal mass 726. The non-equilibrium plasma 722 between the heat sinks 724 may be produced, for example, by means of an AC glow discharge or a corona discharge. The non-equilibrium plasma 722 transfers heat from the molten particles 714 to the two heat sink electrodes 724, which transfer the heat to the outside thermal mass 726. Heat transfer systems or devices generating non-equilibrium plasma and using the plasma to transfer heat to or from atomized molten alloy particles are described in U.S. Pat. No. 6,772,961 B2, the entire disclosure of which has been incorporated herein by reference. In addition, heat transfer systems and devices for generating non-equilibrium plasma and using the plasma to transfer heat to or from articles being cast from molten alloy are described in U.S. patent application Ser. No. 11/008,048, filed Dec. 9, 2004, the entire disclosure of which is hereby incorporated herein by reference.

Figure 8A:
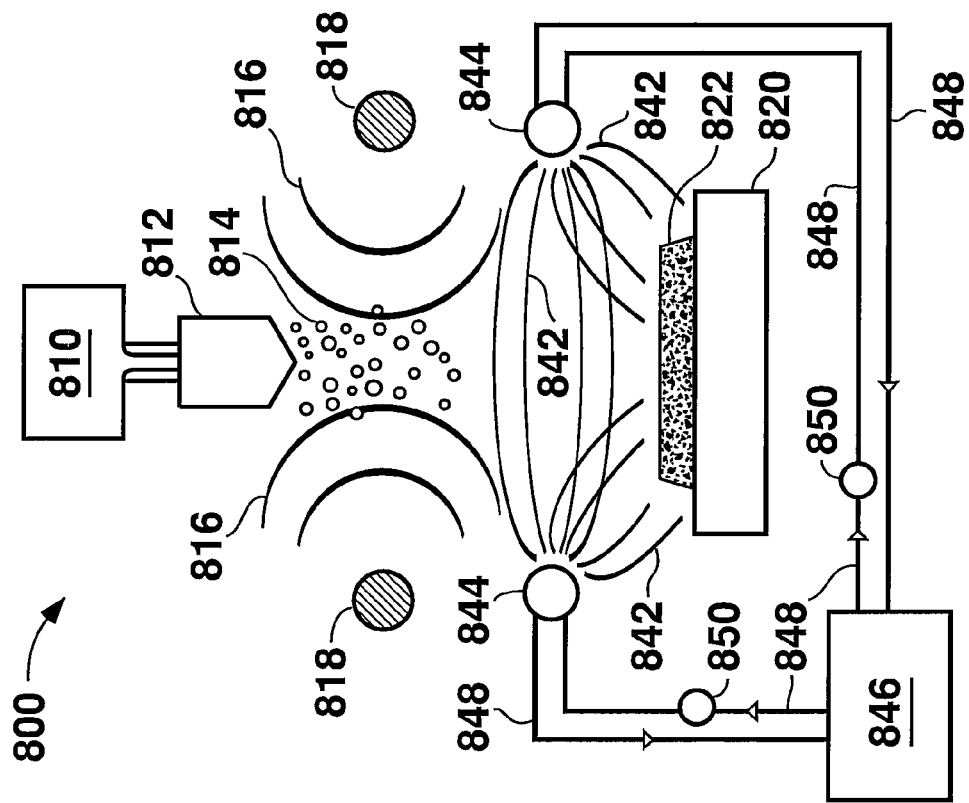
Figure 8:
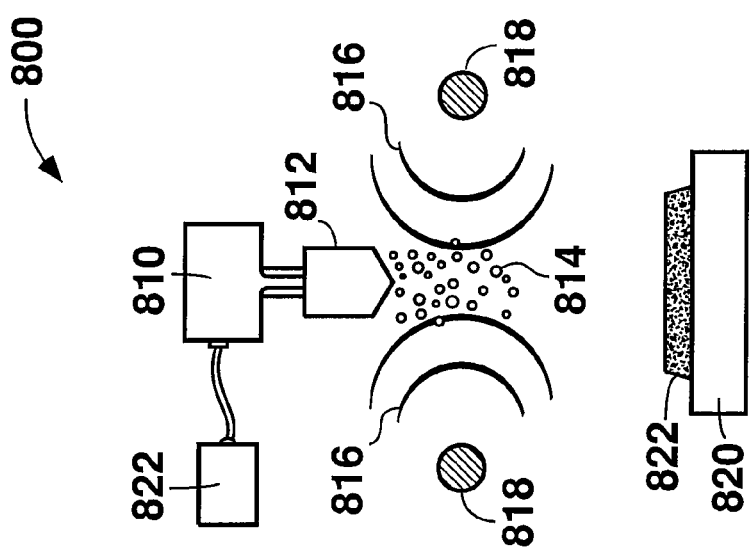

FIG. 8 schematically illustrates certain elements of yet another non-limiting embodiment 800 of an apparatus constructed according to the present disclosure, adapted for spray forming a preform. Melting assembly 810, which is substantially free from ceramic in regions contacting the molten material, provides at least one of a flow and a series of droplets of a molten alloy to an electron beam atomizing assembly 812. The melting assembly 810 optionally may be held at a high negative potential, such as by optional power supply 822, so as to negatively "precharge" the molten material before it passes to the atomizing assembly 812, thereby reducing the quantum of negative charge that the atomizing assembly 812 must convey to the molten material to atomize the material. Such "precharging" feature also may be used with the other embodiments described herein as a means to, for example, reduce the required quantum of negative charge that must be added to the molten material to atomize the material in the atomizing assembly. Electron beam atomizing assembly 812 produces a spray of charged molten alloy particles 814. Electromagnetic field 816 is produced by a magnetic coil 818 (shown sectioned). The charged molten alloy particles 814 interact with the field 816 and are thereby directed generally toward a collector 820. The directional control of the molten particles 814 exerted by field 816 can reduce over-spray, thereby enhancing yield of the spray forming process, and also can enhance density of the solid preform 822.

As shown in the alternate embodiment of FIG. 8A, non-equilibrium plasma 842 optionally may be generated in the path of the molten alloy particles 814 between two heat sink electrodes 844, which are thermally connected to an outside thermal mass 846 by a dielectric liquid that is circulated through conduits 848 by pumps 850. The thermal communication maintained between the heat sink electrodes 844 and the outside thermal mass 846 allows heat to be removed from the molten alloy particles 814. The non-equilibrium plasma 842 between the heat sink electrodes 844 is produced, for example, by means of an AC glow discharge or a corona discharge. The non-equilibrium plasma 842 also extends from the heat sink electrodes 844 to the electrically grounded solid preform 822 and the collector 820, providing for heat removal from the preform 822 and the collector 820. Accordingly, in apparatus 800 heat is transferred from the molten alloy particles 814, the solid preform 822, and the collector 820 by the non-equilibrium plasma 842 to the heat sink electrodes 844, and then to the outside thermal mass 846.

Figure 9A:
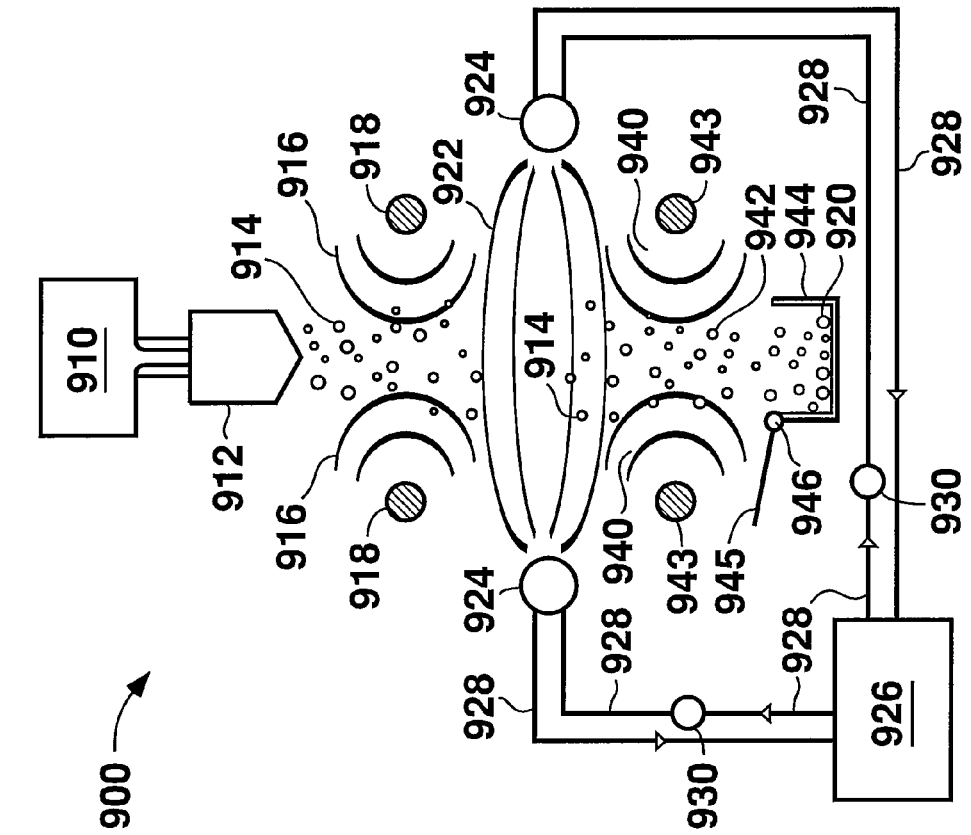
FIGS. 9 and 9A are schematic representations of alternate non-limiting embodiments of an apparatus constructed according to the present disclosure, adapted for forming a powder material.
Figure 9:
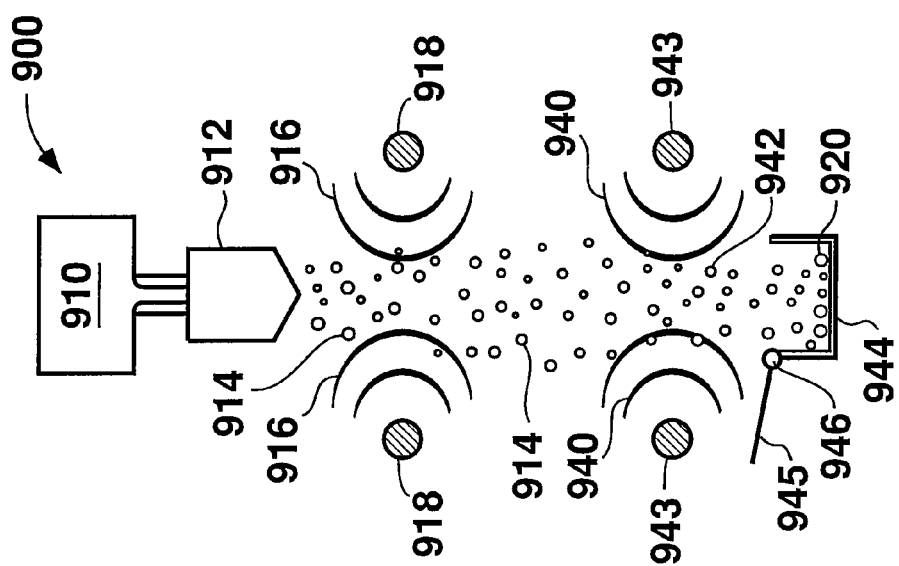

FIG. 9 schematically depicts certain elements of an additional non-limiting embodiment 900 of an apparatus according to the present disclosure, adapted for atomizing molten alloys and forming an alloy powder. Melting assembly 910 provides at least one of a stream and a series of droplets of a molten alloy to an electron beam atomizing assembly 912. Atomizing assembly 912, which is free from ceramic in regions contacting the molten material, produces charged molten alloy particles 914. Electromagnetic field 916 produced by a magnetic coil 918 (shown sectioned) interacts with the charged molten alloy particles 914 to spread out the particles 914 and reduce the probability of their collision, thereby inhibiting formation of larger molten particles and, consequently, larger powder particles 920. A second electromagnetic field 940 produced by a magnetic coil 943 (shown sectioned) interacts with and directs the cooled particles 942 toward a collector in the form of a hopper 944. The hopper 944 may be remotely sealed by lid 945 and lid closure mechanism 946. The entire powder manufacturing process can be carried out in a vacuum environment to reduce or eliminate contamination of the powder 942 by chemical interaction with gases.

Optionally, as shown in FIG. 9A, an alternate embodiment of apparatus 900 may be designed so that non-equilibrium plasma 922 is created in the path of the molten particles 914, between two heat sink electrodes 924 that thermally communicate with an outside thermal mass 926 by a dielectric fluid which circulates through conduit 928 by force of pumps 930. The arrangement of heat sink electrodes 924 thermally communicating with outside thermal mass 926 allows heat to be removed from the molten particles 914.

As suggested, for example, in connection with the apparatus of FIG. 9, certain embodiment of an apparatus constructed according to the present disclosure may include a chamber or the like that encloses or contains all or a portion of the melting assembly, atomizing assembly, field generating assembly, collector, and workpiece (the powder or preform, as the case may be). If, for example, a heat transfer device employing non-equilibrium plasma is incorporated in the apparatus, all or a portion of the heat transfer device and its associated electrodes, as well as the non-equilibrium plasma, also may be encompassed within the chamber. Such a chamber can be provided to allow for regulating the atmosphere within the chamber, including the species and partial pressures of gases present and/or the overall gas pressure within the chamber. For example, the chamber may be evacuated to provide a vacuum (as used herein, "vacuum" refers to a complete or partial vacuum) and/or may be completely or partially filled with an inert gas (e.g., argon and/or nitrogen) to limit oxidation of the materials being processed and/or to inhibit other undesired chemical reactions, such as nitridation. In one embodiment of an apparatus incorporating a chamber, the pressure within the chamber is maintained at less than atmospheric pressure, such as from about 0.1 to about 0.0001 torr, or from about 0.01 to about 0.001 torr.

Molten alloy particles produced by impinging electrons on molten material according to the present disclosure generally are highly negatively charged. Certain embodiments described herein also include means to pre-charge molten material with a negative charge, prior to impinging electrons on and atomizing the molten material. There exists a tendency for the negatively charged particles/material to accelerate toward nearby structures held at ground potential. Such structures may include chamber walls and other apparatus components adjacent the molten material's path of travel downstream of the melting assembly. In certain non-limiting embodiments of an apparatus according the present disclosure, the atomizing assembly of the apparatus includes plates or other suitably-shaped structures held at negative potential and disposed so as to deflect negatively charged particles/material and inhibit undesirable acceleration of the particles/material toward the chamber walls and/or other structures held at ground potential.

Accordingly, as included in each of the above prophetic examples, embodiments of an apparatus constructed according to the present disclosure include a melting assembly substantially free from ceramic in regions that would contact, and therefore could contaminate, molten alloy generated by the melting assembly during operation of the apparatus. Each such apparatus also includes an electron beam atomizing assembly to atomize the molten material and generate molten alloy particles, and a field generating assembly, which generates one or more electromagnetic and/or electrostatic fields between the atomizing assembly and a collector and influences at least one of the acceleration, speed, and direction of the particles as they traverse all or a portion of the distance between the atomizing assembly and the collector.

Optionally, the apparatus further includes means to generate one or more non-equilibrium plasmas for transferring heat to or from the molten alloy particles after they are generated by the atomizing assembly, but before they are collected as a solid workpiece or as a powder. Alternatively, or in addition, embodiments of an apparatus according to the present disclosure may generate one or more non-equilibrium plasmas to transfer heat to or from the molten alloy after it is collected on or in the collector, or is applied to a preform developing on or in the collector.

FIGS. 10-13 schematically illustrate various non-limiting embodiments of melting assemblies that may be included as an element of an apparatus constructed according to the present disclosure. Each such melting assembly embodiment may be used to produce at least one of a stream and a series of droplets of molten alloy from a consumable electrode or other consumable article. Each such melting assembly embodiment below may be constructed so that it lacks ceramic in regions of the embodiment that would be contacted by the molten alloy generated in the embodiments.

Figure 10:
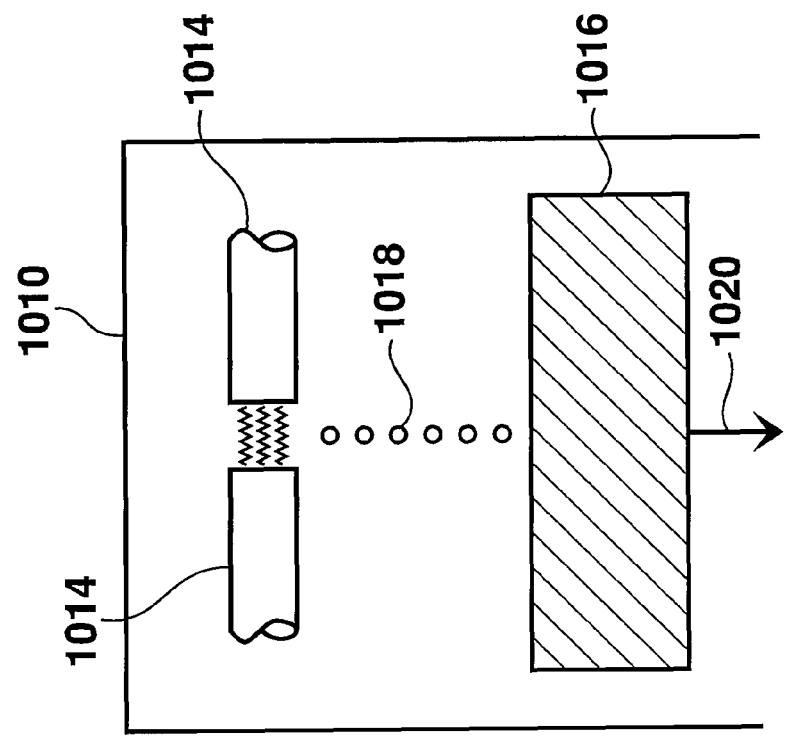

FIG. 10 illustrates use of a vacuum double-electrode remelting device as a component of the melting assembly producing molten alloy that is fed to the electron beam atomizing assembly. The vacuum double-electrode remelting, or "VADER", technique is well known and is described in, for example, U.S. Pat. No. 4,261,412. In a VADER apparatus, molten material is produced by striking an arc in a vacuum between two consumable electrodes, which melt. An advantage of the VADER technique over conventional vacuum arc remelting (VAR) is that the VADER technique allows for much better control of bath temperature and melting rate. Given that VADER apparatus are well known, a detailed description of VADER apparatus and their manner of operation is unnecessary here.

With reference to FIG. 10, vacuum chamber wall 1010 surrounds the opposed consumable electrodes 1014 and the atomizing assembly 1016. Electric current passes between and through the opposed electrodes 1014, melting the electrodes to produce droplets 1018 (or, alternatively, a stream) of molten alloy. The molten alloy droplets 1018 fall from the electrodes 1014 to the atomizing assembly 1016. The atomized molten alloy particles produced by the atomizing assembly 1016 pass through and are influenced by one or more electromagnetic and/or electrostatic fields generated by a field generating assembly (not shown), and then pass onto or into a collector (not shown), examples of which are described below.

Figure 11:
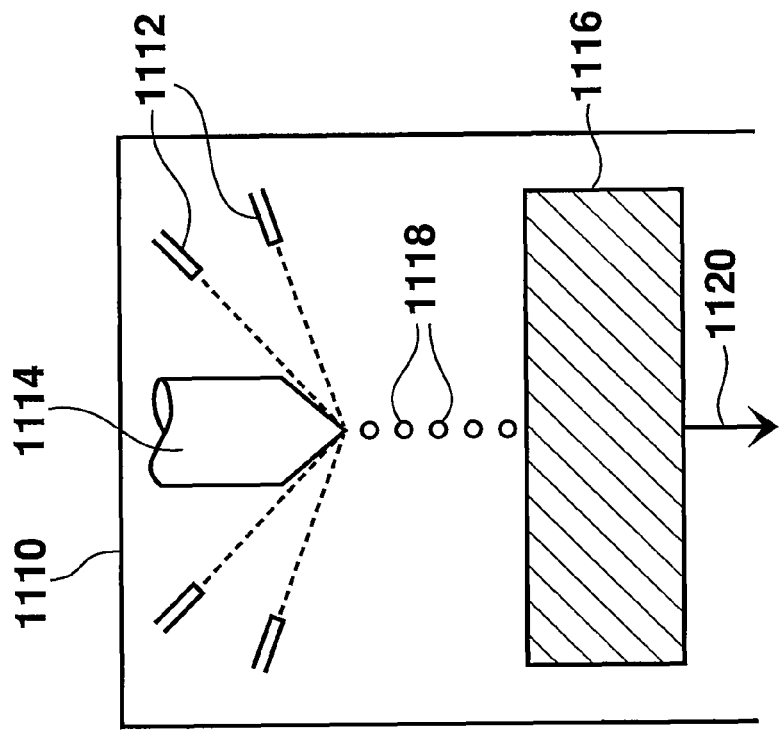
FIGS. 10-13 schematically illustrate several non-limiting embodiments of melting assemblies that may be included in embodiments of apparatus constructed according to the present disclosure.

FIG. 11 illustrates use of an electron beam melting device as the melting assembly producing molten alloy that is fed to the electron beam atomizing assembly. In electron beam melting, the feedstock is melted by impinging high-energy electrons on the feedstock. Contamination of the molten product can be avoided by melting in a controlled vacuum. The energy efficiency of electron beam melting can exceed that of competing processes because of the available control of the electron beam spot dwell time and distribution to the areas to be melted. Also, power losses of the electron beam inside the gun and between the gun nozzle and the target material are small. Electron beam melting devices are well known and, thus, a detailed description of the melting devices and their manner of operation is considered unnecessary.

As discussed above, the melting devices described herein, including the melting device of FIG. 11, for example, may be adapted so as to be maintained at a high negative potential and thereby impart a negative charge to the molten material before it passes downstream to the atomizing assembly of the apparatus. As an example, the melting device shown in FIG. 11 may be adapted to include a melt chamber that is electrically conductive and maintained at a high negative potential, and which the molten material contacts before passing to the atomizing assembly.

Referring to FIG. 11, vacuum chamber 1110 surrounds the melting device's electron beam sources 1112, the consumable electrode 1114 that is being melted, an electron beam atomizing assembly 1116, and a collector (not shown). The electron beams impact the electrode 1114, heating and melting the electrode to produce droplets 1118 (or, alternatively, a stream) of molten alloy. The droplets 1118 fall from the electrode 1114 to the atomizing assembly 1116. The atomized molten alloy particles produced by the atomizing assembly 1116 pass through and are influenced by one or more electromagnetic and/or electrostatic fields generated by a field generating assembly (not shown), and then pass onto or into a collector (not shown), examples of which are described below.

Figure 12:
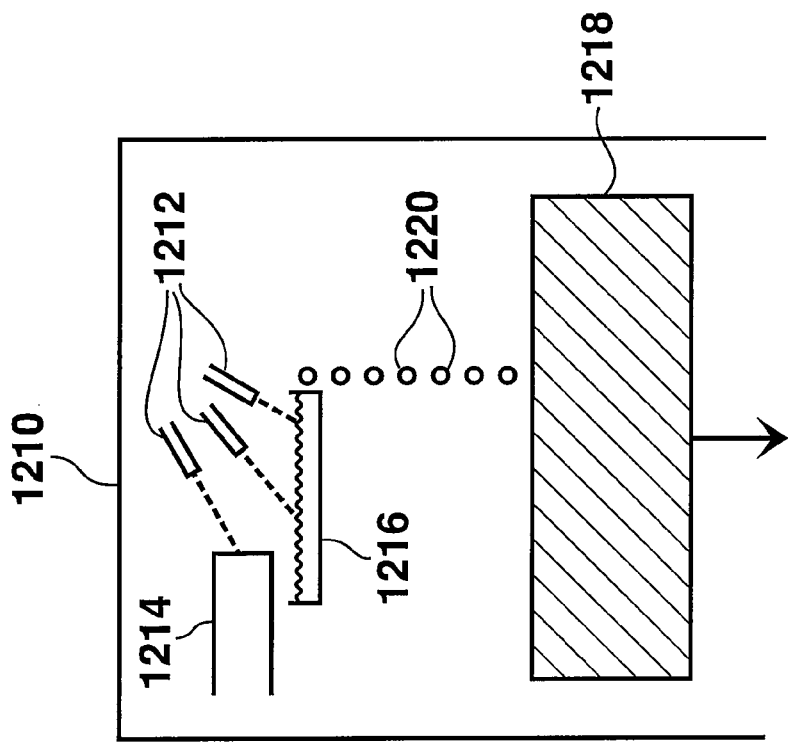

FIG. 12 illustrates use of an electron beam cold hearth melting device as the melting assembly producing molten alloy that is fed to the electron beam atomizing assembly. In a typical electron beam cold hearth melting technique, a first electron beam gun melts the charge, which can have a variety of forms (e.g., ingot, sponge, or scrap). The molten material flows into a shallow water-cooled crucible (the cold hearth), where one or more electron guns maintain the temperature of the molten material. A major function of the cold hearth is to separate inclusions lighter or heavier than the liquid material, while at the same time increasing the residence time of lower density particles that have a high melting point in order to ensure their complete dissolution. All of the operations are conducted in a vacuum environment both to ensure proper operation of the electron guns and to avoid alloy contamination by the ambient environment. An advantage of the electron beam cold hearth melting technique is that it effectively eliminates volatile elements, such as chloride and hydrogen (due to the vacuum), and inclusions in the hearth. The technique also is flexible with respect to the form of the feed materials. Electron beam cold hearth melting devices are well known and, thus, a more detailed description of the melting devices and their manner of operation is considered unnecessary.

Again referring to FIG. 12, vacuum chamber 1210 surrounds the electron beam sources 1212 and a water-cooled copper cold hearth 1216 of the melting assembly, the consumable electrode 1214 that is being melted, an electron beam atomizing assembly 1218, and a collector (not shown). Molten material 1220, in the form of a stream and/or a series of droplets, falls from the water-cooled copper cold hearth 1216 to the atomizing assembly 1218. The atomized molten alloy particles produced by the atomizing assembly 1218 pass through and are influenced by one or more electromagnetic and/or electrostatic fields generated by a field generating assembly (not shown), and pass onto or into a collector (not shown), examples of which are described below.

Figure 13:
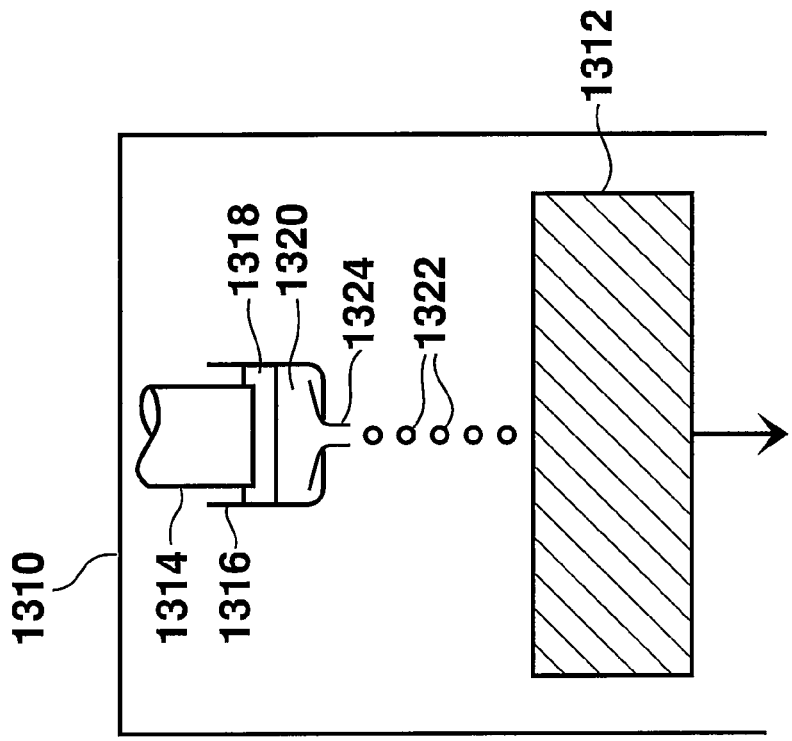

FIG. 13 illustrates use of a melting assembly comprising a combination of an electroslag remelting (ESR) device and a cold induction guide (CIG) to produce molten alloy that is fed to the electron beam atomizing assembly. Alternatively, a melting device combining vacuum arc remelting (VAR) and a CIG may be used in place of the ESR/CIG combination. ESR, VAR, CIG, and melting assemblies comprising ESR/CIG and VAR/CIG combinations are known. Devices combining ESR or VAR devices and a CIG are known and are described in, for example, U.S. Pat. No. 5,325,906.

In a typical ESR technique, electric current is passed through a consumable electrode and an electrically conductive slag disposed within a refining vessel and in contact with the electrode. Droplets melted from the electrode pass through and are refined by the conductive slag, and may then be passed to a downstream apparatus. The basic components of an ESR apparatus include a power supply, an electrode feed mechanism, a water cooled copper refining vessel, and the slag. The specific slag type used will depend on the particular material being refined. The VAR process involves the melting of a consumable electrode composed of the alloy by striking an arc with the electrode in a vacuum. In addition to reducing dissolved nitrogen and hydrogen, the VAR process removes many oxide inclusions in the arc-plasma. ESR and VAR techniques are well known and widely used, and the operating parameters that will be necessary for any particular electrode type and size may readily be ascertained by one having ordinary skill in the art. Accordingly, further detailed discussion of the manner of construction or mode of operation of ESR and VAR apparatus, or the particular operating parameters used for a particular material and/or electrode type and size, is unnecessary.

In the ESR/CIG and VAR/CIG combinations, the CIG, which also is variously referred to a "cold finger" or "cold wall induction guide", can maintain the molten material in molten form as the material passes from the VAR or ESR apparatus downstream to the atomizing assembly. The CIG also protects the molten material from contact with the atmosphere. The CIG preferably is directly coupled upstream to the ESR or VAR apparatus and downstream to the atomizing assembly so as to better protect the refined molten material from the atmosphere, preventing oxides from forming in and contaminating the melt. Certain known designs of a CIG also may be used to control the flow of molten material from the ESR or VAR apparatus to the downstream atomizing assembly.

The construction and manner of use of CIG devices is well known and is described in, for example, U.S. Pat. Nos. 5,272,718, 5,310,165, 5,348,566, and 5,769,151. A CIG generally includes a melt container for receiving molten material. The melt container includes a bottom wall in which is formed an aperture. A transfer region of the CIG is configured to include a passage (which may be, for example, generally funnel-shaped) constructed to receive molten material from the aperture in the melt container. In one conventional design of a CIG, the wall of the funnel-shaped passage is defined by a number of fluid-cooled metallic segments, and the fluid-cooled segments define an inner contour of the passage that may generally decreases in cross-sectional area from an inlet end to an outlet end of the region. One or more electrically conductive coils are associated with the wall of the funnel-shaped passage, and a source of electrical current is in selective electrical connection with the conductive coils. During the time that the molten refined material is flowing from the melt container of the CIG through the passage of the CIG, electrical current is passed through the conductive coils at an intensity sufficient to inductively heat the molten material and maintain it in molten form. A portion of the molten material contacts the cooled wall of the funnel-shaped passage of the CIG and may solidify to form a skull that insulates the remainder of the melt flowing through the CIG from contacting the wall. The cooling of the wall and the formation of the skull assures that the melt is not contaminated by the metals or other constituents from which the inner walls of the CIG are formed. As is known in the art and disclosed in, for example, U.S. Pat. No. 5,649,992, the thickness of the skull at a region of the funnel-shaped portion of the CIG may be controlled by appropriately adjusting the temperature of the coolant, the flow rate of the coolant, and/or the intensity of the current in the induction coils to control or entirely shut off the flow of the melt though the CIG; as the thickness of the skull increases, the flow through the transfer region is correspondingly reduced.

Although CIG apparatus may be provided in various forms, each typically includes: (1) a passage utilizing gravity to guide a melt; (2) cooling means in at least a region of the wall to promote skull formation on the wall; and (3) electrically conductive coils associated with at least a portion of the passage, for inductively heating molten material within the passage. Persons having ordinary skill in the art may readily provide an appropriately designed CIG having any one or all of the forgoing three features for use in an apparatus constructed according to the present invention without further discussion herein. Given that such devices are well known and described in the technical literature, a more detailed description is considered unnecessary herein.

Again referring to FIG. 13, vacuum chamber 1310 surrounds an ESR/CIG melting assembly, an electron beam atomizing assembly 1312, and a collector (not shown). The ESR/CIG melt source includes a consumable electrode 1314 of the desired alloy and a water-cooled copper crucible 1316. A heated molten slag 1318 acts to melt the electrode 1314 to form a molten alloy pool 1320. The molten alloy from the molten pool 1320 flows through the CIG nozzle 1324, in the form of a molten stream and/or a series of droplets 1322, and passes to the atomizing assembly 1312. The atomized molten alloy particles produced by the atomizing assembly 1312 pass through and are influenced by one or more electromagnetic and/or electrostatic fields generated by a field generating assembly (not shown), and pass onto or into a collector (not shown), examples of which are described below.

Possible alternative techniques for melting feedstock in the melting assembly of an apparatus constructed according to the present disclosure will be apparent to those having ordinary skill in the art. One non-limiting example of an alternative melting technique is induction melting. In one possible application of induction melting, a coiled primary electrical conductor may surround a bar of metallic feed material. By passing electrical current through the primary conductor a secondary electric current is generated within the bar through electromagnetic induction. The secondary current heats the bar to a temperature greater than its melting temperature.

FIGS. 14-17 illustrate several non-limiting examples of methods that may be used to collect the solidified atomized material in various non-limiting embodiments of apparatus and methods constructed according to the present disclosure.

FIG. 14 schematically illustrates an atomized powder being collected in the bottom of a collector that is a simple chamber. The vacuum chamber 1410 encloses an electron beam atomizing assembly 1412. A series of droplets of molten alloy 1414 produced by a melting assembly (not shown), which may be, for example, one of the various melting assemblies discussed above, passes into the atomizing assembly 1412. The atomizing assembly 1412 produces atomized molten alloy particles 1416, which pass through, interact with, and are influenced by the electromagnetic and/or electrostatic field(s) 1413 generated by electromagnetic coil 1417 (shown sectioned) of a field generating assembly. The coil 1417 is positioned to produce the field(s) in the region 1418 downstream of the atomizing assembly 1412. The atomized molten material 1416 is collected as a powder at the bottom of the chamber 1412.

FIG. 15 schematically illustrates the production of a spray formed solid ingot from an atomized molten alloy produced by electron beam atomization using an embodiment of an apparatus constructed according to the present disclosure. Vacuum chamber 1510 encloses a melting assembly (not shown) and an electron beam atomizing assembly 1512. The melting assembly may be, for example, one of the various melting assemblies discussed above. Droplets of molten alloy 1514 produced by the melting assembly (not shown) pass into the atomizing assembly 1512. The droplets of molten alloy 1514 are atomized within the atomizing assembly 1512 to form a spray of atomized molten alloy particles 1516. The atomized molten alloy particles 1516 pass through, interact with, and are influenced by one or more electromagnetic and/or electrostatic fields (not indicated) generated by plates 1218 of a field generating assembly. The plates 1518 are connected to a power source (not shown) by wires 1520 passing through the walls of the chamber 1510. The atomized molten alloy particles 1516 are directed onto rotating collector plate 1524 under influence of the field(s) generated by the field generating assembly to form a solid preform 1525. The rotating collector plate 1524 can be withdrawn downwardly at a rate that maintains the deposition interface at a substantially constant distance from the atomizing assembly. To enhance yield and improve deposition density, the collector plate 1524 may be charged to a high positive potential by connecting the plate 1524 to a power supply (not shown) by wires 1526 passing through the wall of the chamber 1510.

Figure 16:
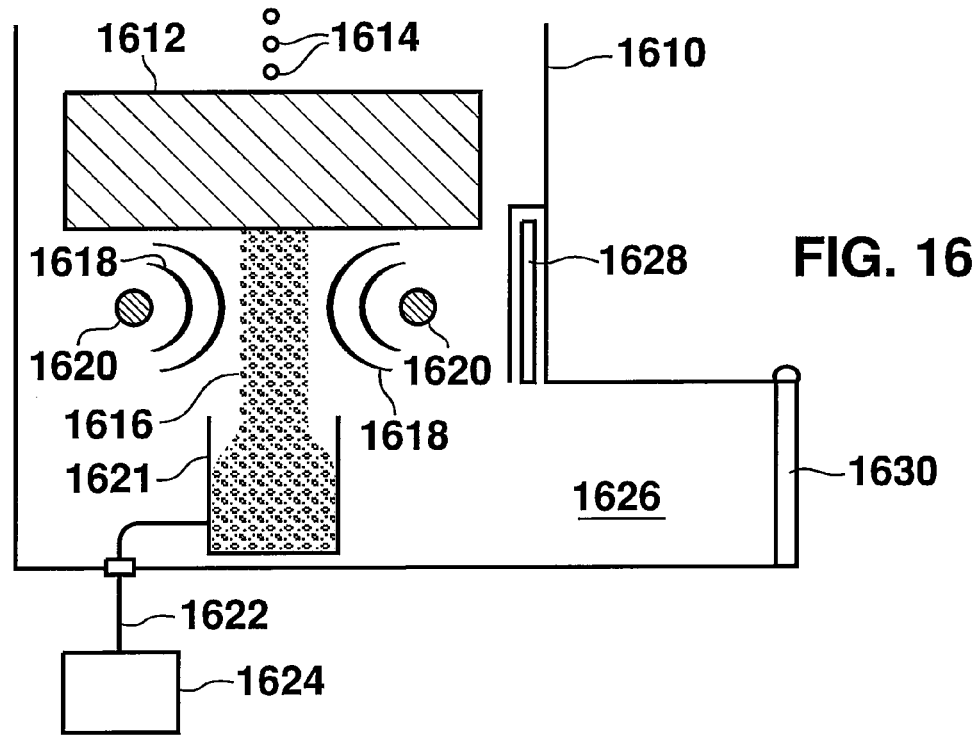

FIG. 16 schematically illustrates an embodiment of an apparatus according to the present disclosure wherein atomized alloy powder is collected in a can or other suitable container disposed in a first chamber of the apparatus. The filled container is transferred into a smaller chamber that encloses some or all of the elements of the apparatus. In the smaller chamber, a lid may welded to the container prior to hot working the container and its powder contents, to produce a consolidated solid article. Vacuum chamber 1610 encloses a melting assembly (not shown) and an electron beam atomizing assembly 1612. The melting assembly may be, for example, one of the various melting assemblies discussed above. A series of droplets of molten alloy 1614 produced by the melting assembly (not shown) pass into the atomizing assembly 1612. The droplets of molten alloy 1614 are atomized within the atomizing assembly 1612 to form molten alloy particles 1616. The molten alloy particles 1616 pass through, interact with, and are influenced by one or more electromagnetic and/or electrostatic fields 1618 generated by electromagnetic coil 1620 (shown sectioned) of a field generating assembly. The atomized molten particles 1616 are directed into a collector in the form of a container 1621 under influence of the field 1618. When the container 1621 is sufficiently full of powdered atomized molten material 1616, it is transferred into chamber 1626, which is then sealed by vacuum lock 1628. A lid can then be secured to the filled container 1621, and the container 1621 may be released to the atmosphere via a second vacuum lock 1630 for thermomechanical processing according to known techniques. Optionally, the apparatus of FIG. 16 includes a heat transfer device, such as is generally described above, adapted to remove heat from the molten alloy particles 1616. Also, optionally, the container 1621 is electrically connected to power supply 1624 by wire 1622 and is held at a positive potential while the negatively charged molten particles 1616 are being collected in the container 1621. The wire 1622 may be remotely disconnected from the container 1621 before the container is moved into chamber 1626.

Figure 17:
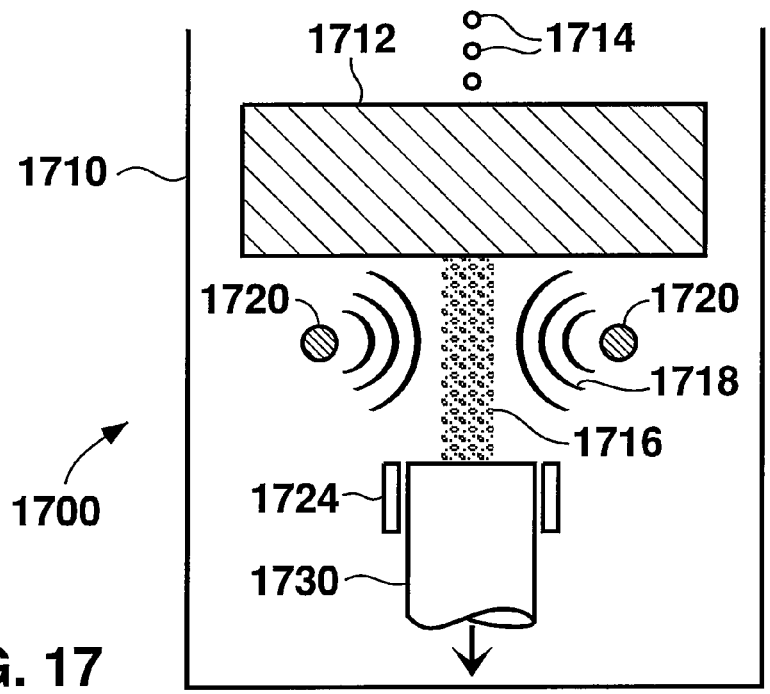
FIGS. 17 and 17A schematically illustrate non-limiting embodiments of an apparatus constructed according to the present disclosure wherein a cast article is produced in a mold by nucleated casting an atomized molten alloy produced by electron beam atomization.

FIG. 17 schematically illustrates a non-limiting embodiment of an apparatus 1700 constructed according to the present disclosure wherein a cast article is produced in a mold by nucleated casting an atomized molten alloy produced by electron beam atomization. Vacuum chamber 1710 encloses elements including a melting assembly (not shown) and an electron beam atomizing assembly 1712. The melting assembly may be, for example, one of the various melting assemblies discussed above. A series of droplets of molten alloy 1714 produced by the melting assembly pass into the atomizing assembly 1712. The droplets of molten alloy 1714 are atomized within the atomizing assembly 1712 to form a spray of atomized molten alloy particles 1716. The atomized molten alloy particles 1716 pass through, interact with, and are influenced by the one or more electromagnetic and/or electrostatic fields 1718 generated by the electrically energized coil 1720 (shown sectioned) of a field generating assembly. The atomized molten material 1716 is directed into mold 1724 under influence of the field 1718 generated by the field generating assembly, and the resulting solid casting 1730 is withdrawn from the mold 1724 by downward movement of the mold base (not shown). Optionally, the mold base may be adapted to rotate or otherwise translate in a suitable manner.

Figure 17A:
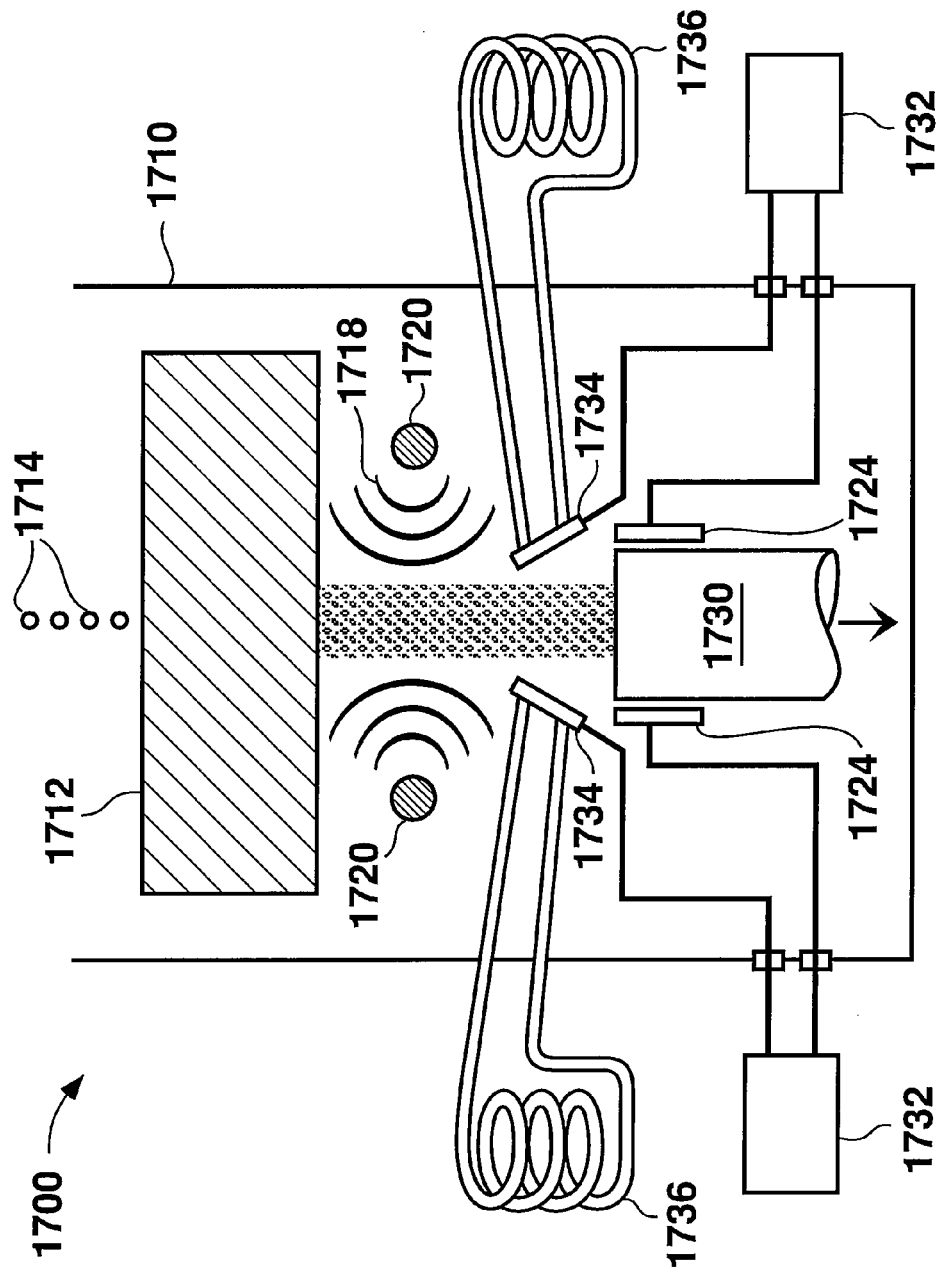

In an alternate non-limiting embodiment of apparatus 1700 shown in FIG. 17A, power supplies 1732 are provided and create a potential difference so as to form a non-equilibrium plasma emanating from the electrodes 1734. Heat is conducted by the plasma from the surface of the solidifying ingot 1730 to the electrodes 1734, which are cooled with a dielectric liquid that circulates through heat exchangers 1736 and the electrodes 1734.

Using various features described above, it would be readily apparent to one of ordinary skill in the art that the foregoing prophetic embodiments could be implemented as provided. Moreover, the foregoing embodiments may be modified so as to combine different elements described herein and provide additional embodiments of apparatus and methods according to the present disclosure.

Accordingly, certain aspects of the present disclosure are directed to apparatus comprising a melting assembly substantially free from ceramic in regions contacted by molten alloy, an electron beam atomizing assembly, a field generating assembly, and a collector.

Although the foregoing description has necessarily presented only a limited number of embodiments, those of ordinary skill in the relevant art will appreciate that various changes in the apparatus and methods and other details of the examples that have been described and illustrated herein may be made by those skilled in the art, and all such modifications will remain within the principle and scope of the present disclosure as expressed herein and in the appended claims. It will also be appreciated by those skilled in the art that changes could be made to the embodiments above without departing from the broad inventive concept thereof. It is understood, therefore, that this invention is not limited to the particular embodiments disclosed, but it is intended to cover modifications that are within the principle and scope of the invention, as defined by the claims.

We claim:

1. A method of forming one of a powder and a solid preform, the method comprising:
   producing at least one of a stream of molten alloy and a series of droplets of molten alloy in a melting assembly;
   generating particles of the molten alloy by impinging at least one three-dimensional linear electron field on the at least one of a stream of molten alloy and the series of droplets of molten alloy to atomize the molten alloy and produce the molten alloy particles; and
   collecting the molten alloy particles as one of a powder and a solid preform.

2. The method of claim 1, wherein the melting assembly is substantially free from ceramic in regions of the melting assembly contacted by the molten alloy.

3. The method of claim 1, wherein producing at least one of a stream of molten alloy and a series of droplets of a molten alloy comprises melting a material using at least one of a vacuum double-electrode remelting device, a device comprising an electroslag remelting device and a cold induction guide, an electron beam melting device, and an electron beam cold hearth melting device.

4. The method of claim 1, wherein collecting the particles of molten alloy comprises collecting the particles on or in one of a surface, a platen, a mandrel, a mold, a chamber, and a can.

5. The method of claim 1, wherein collecting the molten alloy particles comprises holding a collector at one of a ground potential and a positive potential to thereby attract negatively charged molten alloy particles produced by impinging electrons on the molten alloy. A1

6. The method of claim 1, wherein the method forms a solid preform.

7. The method of claim 1, wherein the method comprises one of spray forming and nucleated casting and produces a solid preform as a product.

8. A method of processing a molten alloy comprising:
   providing at least one of a stream of molten alloy and droplets of molten alloy;
   directing the at least one of a stream of molten alloy and droplets of molten alloy into a flow path;
   generating electrons from at least one electron beam emitter;
   directing the electrons to provide at least one three-dimensional linear electron field; and
   projecting the at least one three-dimensional linear electron field into the flow path of the molten alloy, wherein the electrons impinge on the molten alloy and produce molten alloy particles.

9. The method of claim 8, wherein directing the electrons to provide the at least one linear electron field comprises directing the electrons with at least one of an electrostatic field and an electromagnetic field.

10. The method of claim 8, wherein the at least one linear electron field is in the form of a cylindrical spatial distribution through which the flow path of the molten alloy is directed.

11. The method of claim 10, wherein a longitudinal axis of the cylindrical spatial distribution of electrons is oriented generally in the direction of the flow path of the molten alloy.

12. The method of claim 8, wherein the at least one linear electron field is in the form of a rectangular spatial distribution through which the flow path of the molten alloy is directed.

13. The method of claim 12, wherein a rectangular electron beam is rastered to provide the rectangular spatial distribution of electrons.

14. The method of claim 8, wherein the electrons are directed to form a diffuse spot and the diffuse spot is rastered to provide a three-dimensional spatial distribution of electrons having a controlled shape.

15. The method of claim 8, wherein the electron beam emitter comprises a filament having a straight length.

16. The method of claim 15, wherein the filament provides electrons directed to form a rectangular spatial distribution within the flow path of the molten alloy.

17. The method of claim 8, wherein the electron beam emitter comprises a thermionic electron beam emitter.

18. The method of claim 8, wherein a plurality of electron beam emitters generate a three-dimensional field of electrons within the flow path of the molten alloy.

19. The method of claim 8, further comprising collecting the molten alloy particles on or in one of a surface, a platen, a mandrel, a mold, a chamber, and a can.

20. The method of claim 8, wherein the method forms one of a powder and a solid preform.

21. The method of claim 8, wherein the method comprises one of spray forming and nucleated casting and produces a solid preform as a product.

* * * * *